(12) United States Patent
Gwon et al.

(10) Patent No.: US 11,656,709 B2
(45) Date of Patent: *May 23, 2023

(54) DISPLAY DEVICE AND METHOD OF MANUFACTURING THE SAME

(71) Applicant: LG DISPLAY CO., LTD., Seoul (KR)

(72) Inventors: Hyangmyoung Gwon, Paju-si (KR); MinJoo Kim, Paju-si (KR); JaeWon Lee, Paju-si (KR); SangHoon Pak, Paju-si (KR); Byonghoo Kim, Paju-si (KR); Sangheun Lee, Paju-si (KR); Sanghyuk Won, Paju-si (KR); Jeonghoon Lee, Paju-si (KR); Sungjin Kim, Paju-si (KR); Jaehyung Jang, Paju-si (KR); Yuna Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,233

(22) Filed: Mar. 14, 2022

(65) Prior Publication Data
US 2022/0197426 A1 Jun. 23, 2022

Related U.S. Application Data

(63) Continuation of application No. 17/077,861, filed on Oct. 22, 2020, now Pat. No. 11,307,695, which is a
(Continued)

(30) Foreign Application Priority Data

Oct. 31, 2017 (KR) ........................ 10-2017-0143997

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0443* (2019.05);
(Continued)

(58) Field of Classification Search
None
See application file for complete search history.

(56) References Cited

U.S. PATENT DOCUMENTS 9,954,200 B2 4/2018 Kim et al.
2008/0169461 A1 7/2008 Park
(Continued)

FOREIGN PATENT DOCUMENTS

CN 102487064 A 6/2012
CN 103904097 A 7/2014
(Continued)

OTHER PUBLICATIONS

German Office Action dated Nov. 18, 2021 issued in corresponding Patent Application No. 10 2018 127 234.0 (8 pages).
(Continued)

*Primary Examiner* — Nicholas J Lee
(74) *Attorney, Agent, or Firm* — Polsinelli PC

(57) ABSTRACT

A display device and a method of manufacturing the same are disclosed, in which arcing may be prevented from occurring. The display device comprises a first substrate including a display area on which pixels are arranged, and a non-display area surrounding the display area; a dam surrounding the display area, arranged on the non-display area; a pad electrode arranged outside the dam; and an encapsulation film covering the display area and including a first inorganic film and a second inorganic film arranged on the first inorganic film, wherein the second inorganic film is overlapped with the pad electrode.

14 Claims, 16 Drawing Sheets

Related U.S. Application Data continuation of application No. 16/177,205, filed on Oct. 31, 2018, now Pat. No. 10,854,843.

(51) Int. Cl.

| | |
|---|---|
| *H01L 51/52* | (2006.01) |
| *G09G 3/3225* | (2016.01) |
| *H01L 27/32* | (2006.01) |
| *H01L 51/56* | (2006.01) |
| *G09G 3/20* | (2006.01) |

(52) U.S. Cl.
CPC ........ *G06F 3/0446* (2019.05); *G06F 3/04164* (2019.05); *G09G 3/3225* (2013.01); *H01L 27/323* (2013.01); *H01L 27/3246* (2013.01); *H01L 27/3276* (2013.01); *H01L 51/5246* (2013.01); *H01L 51/5253* (2013.01); *H01L 51/5256* (2013.01); *H01L 51/56* (2013.01); *G06F 2203/04102* (2013.01); *G06F 2203/04103* (2013.01); *G06F 2203/04111* (2013.01); *G09G 3/20* (2013.01); *G09G 2310/0264* (2013.01); *H01L 27/3206* (2013.01)

(56) References Cited

U.S. PATENT DOCUMENTS

| | | |
|---|---|---|
| 2011/0199564 A1 | 8/2011 | Moriwaki |
| 2015/0108452 A1 | 4/2015 | Park et al. |
| 2015/0255748 A1 | 9/2015 | Boesch et al. |
| 2016/0195965 A1 | 7/2016 | Kim et al. |
| 2016/0285038 A1 | 9/2016 | Kim |
| 2017/0040406 A1 | 2/2017 | Park et al. |
| 2017/0077447 A1 | 3/2017 | Kang et al. |
| 2017/0288008 A1 | 10/2017 | Kim et al. |
| 2017/0331058 A1 | 11/2017 | Seo et al. |
| 2017/0352692 A1 | 12/2017 | Lee et al. |
| 2018/0018053 A1 | 1/2018 | No et al. |
| 2018/0226454 A1 | 8/2018 | Liu et al. |
| 2019/0095007 A1 | 3/2019 | Jeong et al. |

FOREIGN PATENT DOCUMENTS

| | | | |
|---|---|---|---|
| CN | 104253245 A | | 12/2014 |
| CN | 104347673 A | | 2/2015 |
| CN | 105742324 A | | 7/2016 |
| CN | 106409869 A | | 2/2017 |
| CN | 106997895 A | | 8/2017 |
| CN | 107017278 A | | 8/2017 |
| DE | 10 2010 022 260 A1 | | 9/2011 |
| EP | 3 236 309 A1 | | 10/2017 |
| EP | 3 432 379 A1 | | 1/2019 |
| JP | 2014-199795 A | | 10/2014 |
| KR | 10-2017-0015629 A | | 2/2017 |
| KR | 10-2017-0079901 A | | 7/2017 |

OTHER PUBLICATIONS

Korean Office Action dated Nov. 18, 2021 issued in corresponding Patent Application No. 10-2017-0143997 (5 pages).

Japanese Office Action dated Nov. 5, 2019 issued in counterpart Patent Application No. 2018-205105 (5 pages).

China Office Action dated Oct. 26, 2022 issued in Patent Application No. 201811288186.X (6 pages).

DISPLAY DEVICE AND METHOD OF MANUFACTURING THE SAME

CROSS REFERENCE TO RELATED APPLICATION

This application is a continuation of U.S. patent application Ser. No. 17/077,861, filed on Oct. 22, 2020, which is a continuation of U.S. patent application Ser. No. 16/177,205, filed on Oct. 31, 2018, now U.S. Pat. No. 10,854,843 issued on Dec. 1, 2020, which claims the benefit of the Korean Patent Application No. 10-2017-0143997 filed on Oct. 31, 2017, all of which are hereby incorporated by reference in their entirety as if fully set forth herein.

BACKGROUND

Field of the Disclosure

The present disclosure relates to a display device and a method of manufacturing the same.

Description of the Background

With the advancement of the information age, a demand for a display device for displaying an image has been increased in various forms. Therefore, various display devices such as liquid crystal display (LCD) devices, plasma display panel (PDP) devices, and organic light emitting display (OLED) devices have been used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

However, the organic light emitting display device includes pixels, each of which includes an organic light emitting diode, and has a disadvantage in that the organic light emitting diode may be easily degraded by external factors such as external water and oxygen. In order to prevent this, the organic light emitting display device forms an encapsulation film to prevent external water and oxygen from being permeated into the organic light emitting diode.

The encapsulation film includes at least one inorganic film and at least one organic film to prevent oxygen or water from being permeated into an organic light emitting layer and an electrode. At this time, at least one organic film generally includes a polymer, and is formed by a hardening process after being doped on a substrate in a liquid type. Since such an organic film has flexibility until the hardening process is performed, a problem may occur in that the organic film may overflow outside an area where the encapsulation film is to be formed. For example, the organic film may overflow toward a pad area where a plurality of pads is provided. To solve this problem, a dam for blocking a flow of the organic film is formed along the outside of the organic light emitting diode.

Also, to protect the organic light emitting diode from oxygen or water, at least one inorganic film is entirely formed on the organic light emitting diode except for a pad area where a pad electrode is arranged. In the manufacturing method of the related art, to expose the pad electrode, a mask for covering the pad electrode is arranged on the pad electrode, and then the inorganic film is formed. The mask is arranged to be close to the pad electrode such that the inorganic film is not formed in the pad area. At this time, arcing may occur between a boundary surface of the mask for covering the pad area and the pad electrode. If arcing occurs between the mask and the pad electrode, a high current entering the pad electrode from the mask may flow into the display device along the pad electrode, whereby a defect may occur.

SUMMARY

The present disclosure has been made in view of the above problems, and the present disclosure is to provide a display device and a method of manufacturing the same.

In addition, the present disclosure is to provide a display device and a method of manufacturing the same in which arcing may be prevented from occurring.

In accordance with an aspect of the present disclosure, the above and other objects can be accomplished by the provision of a display device and a method of manufacturing the same, the display device comprising a first substrate including a display area on which pixels are arranged, and a non-display area surrounding the display area; a dam surrounding the display area, arranged on the non-display area; a pad electrode arranged outside the dam; and an encapsulation film covering the display area and including a first inorganic film and a second inorganic film arranged on the first inorganic film, wherein the second inorganic film is overlapped with the pad electrode.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a display device and a method of manufacturing the same according to the preferred embodiment of the present disclosure will be described with reference to the accompanying drawings. Wherever possible, the same reference numbers will be used throughout the drawings to refer to the same or like parts. Also, in the following description of the present disclosure, if detailed description of elements or functions known in respect of the present disclosure is determined to make the subject matter of the present disclosure unnecessarily obscure, the detailed description will be omitted.

Hereinafter, the preferred embodiment of the present disclosure will be described with reference to the accompanying drawings.

Figure 1:
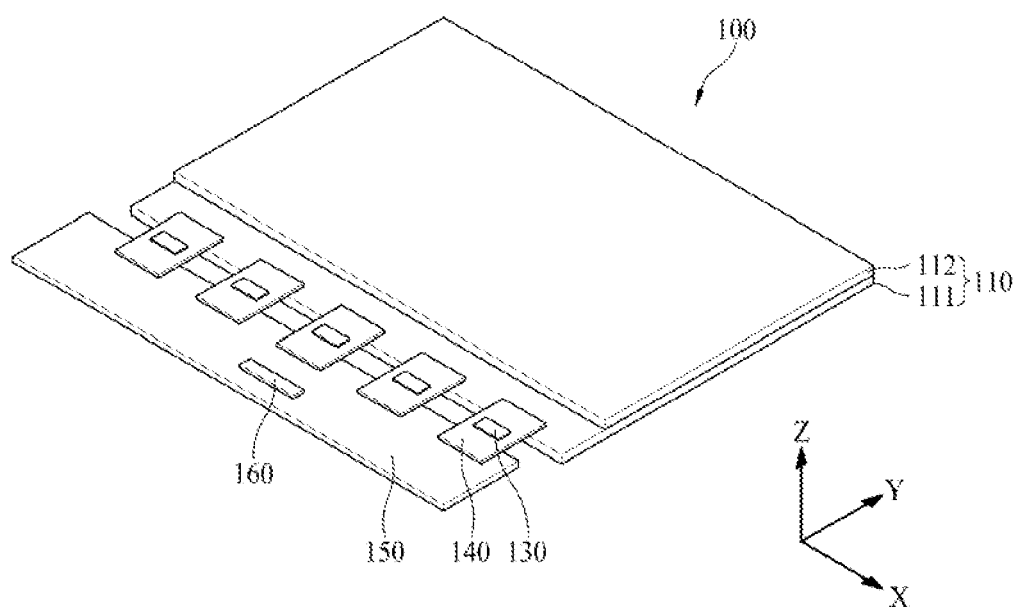
FIG. 1 is a perspective view illustrating a display device according to one embodiment of the present disclosure.
Figure 2:
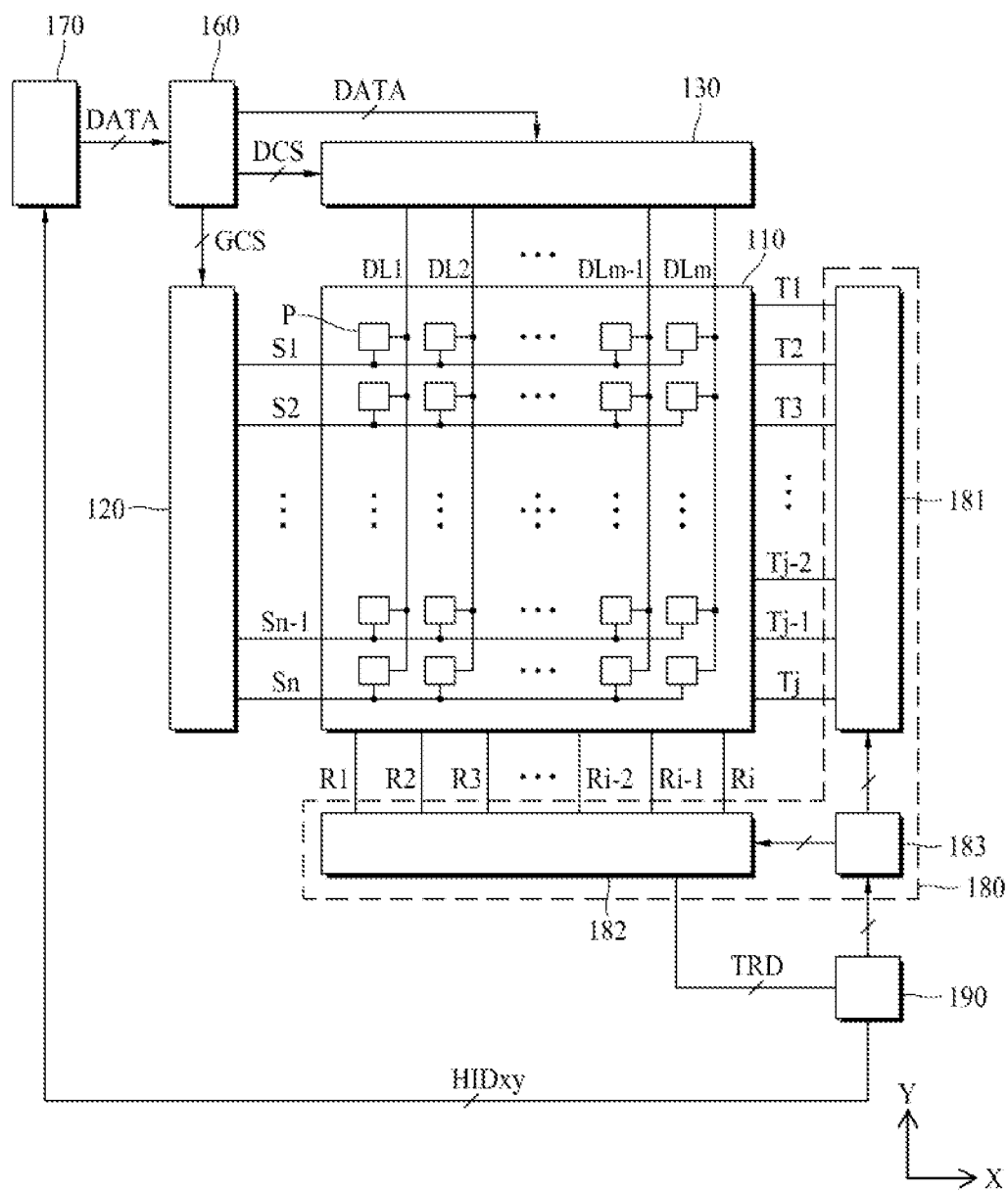
FIG. 2 is a block view illustrating a display device according to one embodiment of the present disclosure.

FIG. 1 is a perspective view illustrating a display device according to one embodiment of the present disclosure. FIG. 2 is a block view illustrating a display device according to one embodiment of the present disclosure.

Referring to FIGS. 1 and 2, the display device according to the embodiment of the present disclosure includes a display panel 110, a scan driver 120, a data driver 130, a timing controller 160, a host system 170, a touch driver 180, and a touch coordinate calculator 190.

The display device with a built-in touch screen according to the embodiment of the present disclosure may be realized as a flat panel display device such as a Liquid Crystal Display (LCD), Field Emission Display (FED), Plasma Display Panel (PDP), Organic Light Emitting Display (OLED), and Electrophoresis display (EPD). Hereinafter, the display device with a built-in touch screen according to the embodiment of the present disclosure is realized as, but not limited to, an organic light emitting display device.

The display panel 110 includes a display area on which pixels P are arranged to display an image. On the display area 110, data lines DL1 to DLm (m is a positive integer of 2 or more) and scan lines S1 to Sn (n is a positive integer of 2 or more) are provided. The data lines DL1 to DLm may be formed to cross the scan lines S1 to Sn. The pixels P may be formed on the area defined by a crossed structure of the gate lines and data lines.

Each of the pixels P of the display panel 110 may be connected to any one of the data lines DL1 to DLm and any one of the scan lines S1 to Sn. Each of the pixels P of the display panel 110 may include a driving transistor for controlling a drain-source current in accordance with a data voltage applied to a gate electrode, a scan transistor turned on by a scan signal of the scan line, supplying a data voltage of the data line to the gate electrode of the driving transistor, an organic light emitting diode for emitting light in accordance with the drain-source current of the driving transistor, and a capacitor for storing a voltage of the gate electrode of the driving transistor. Therefore, each of the pixels P may emit light in accordance with the current supplied to the organic light emitting diode.

The scan driver 120 receives a scan control signal GCS from the timing controller 160. The scan driver 120 supplies scan signals to the scan lines S1~Sn in accordance with the scan control signal GCS.

The scan driver 120 may be formed in a non-display area outside one side or both sides of a display area of the display panel 110 in a GIP (gate driver in panel) mode. Alternatively, the scan driver 120 is fabricated of a driving chip, packaged in a flexible film, and may be attached to the non-display area outside one side or both sides of the display area of the display panel 110 in a TAB (tape automated bonding) mode.

The data driver 130 receives digital video data DATA and a data control signal DCS from the timing controller 160. The data driver 130 converts the digital video data DATA into an analogue positive polarity/negative polarity data voltage in accordance with the data control signal DCS and supplies them to the data lines. That is, pixels to which the data voltages will be supplied are selected by the scan signals of the scan driver 120, and the data voltages are supplied to the selected pixels.

The data driver 130 may include a plurality of source drive ICs. Each of the plurality of source drive ICs may be packaged into the flexible film 140 in a COF (chip on film) or COP (chip on plastic) mode. The flexible film 140 is attached onto pads provided on the non-display area of the display panel 110 using an anisotropic conducting film, whereby the source drive ICs may be connected to the pads.

The circuit board 150 may be attached to the flexible films 140. A plurality of circuits realized as driving chips may be packaged onto the circuit board 150. For example, the timing controller 160 may be packaged onto the circuit board 150. The circuit board 150 may be a printed circuit board or flexible printed circuit board.

The timing controller 160 receives digital video data DATA and timing signals from the host system 170. The timing signals may include a vertical synchronization signal, a horizontal synchronization signal, a data enable signal, and a dot clock. The vertical synchronization signal is a signal defining one frame period. The horizontal synchronization signal is a signal defining one horizontal period needed to supply the data voltages to pixels of one horizontal line of the display panel DIS. The data enable signal is a signal for defining a period of inputting available data. The dot clock is a signal repeated with a predetermined short period.

In order to control operation timings of the scan driver 120 and the data driver 130, the timing controller 160 generates a data control signal DCS to control operation timing of the data driver 130 and a scan control signal GCS for controlling operation timing of the data driver 130 based on the timing signals. The timing controller 160 outputs the scan control signal GCS to the scan driver 120 and outputs the digital video data DATA and the data control signal DCS to the data driver 130.

The host system 170 may be realized as a navigation system, a set-top box, a DVD player, a blue-ray player, a personal computer (PC), a home theater system, a broadcasting receiver, and a phone system. The host system 170 includes SOC (i.e., system on chip) equipped with a scaler and converts the digital video data DATA of an input image to a format suitable to display the display panel 110. The host system 170 transmits the digital video data DATA and the timing signals to the timing controller 160.

On the display panel 110, not only the data lines DL1 to DLm and the scan lines S1 to Sn but also first and the second touch electrodes may be formed. The first touch electrodes may be formed to cross the second touch electrodes. The first touch electrodes may be connected to a first touch driver 181 through first touch lines T1 to Tj, where j is an integer equal to or greater than 2. The second touch electrodes may be connected to a second touch driver 182 through second touch lines R1 to Ri, where i is an integer equal to or greater than 2. On each of the intersections between the first touch electrodes and the second touch electrodes, a touch sensor may be formed. The touch sensor according to the embodiment of the present disclosure is realized as, but not limited to, a mutual capacitance. The first and the second touch electrodes will be described later in more detail with reference to FIG. 4.

The touch driver 180 supplies a driving pulse to the first touch electrodes through the first touch lines T1 to Tj and senses the amount of charge changes in each of the touch sensors through the second touch lines R1 to Ri. That is, in FIG. 2, description will be given based on that the first touch lines T1 to Tj are Tx lines for supplying a driving pulse and the second touch lines R1 to Ri are Rx lines for sensing the amount of charge changes in in each of the touch sensors.

The touch driver 180 includes the first touch driver 181, the second touch driver 182, and the touch controller 183. The first touch driver 181, the second touch driver 182, and the touch controller 183 may be integrated into one ROIC (i.e., read-out IC).

The first touch driver 181 selects the first touch line to output a driving pulse under the control of the touch controller 183 and supplies the driving pulse to the selected first touch line. For example, the first touch driver 181 may sequentially supply driving pulses to the first touch lines T1 to Tj.

The second touch driver 182 selects the second touch lines to receive the amount of charge changes in the touch sensors under the control of the touch controller 183 and receives the amount of charge changes in the touch sensors through the selected second touch lines. The second touch driver 182 converts the amount of charge changes in the touch sensors, which are received through the second touch lines R1 to Ri, to touch raw data TRD corresponding to digital data, by sampling the amount of charge changes in the touch sensors.

The touch controller 183 may generate a Tx setup signal in the first touch driver 181 to set up the first touch line to which the driving pulse is to be output and an Rx setup signal in the second touch line to set up the second touch line in which a touch sensor voltage is to be received. Also, the touch controller 183 generates timing control signals to control operation timings of the first touch driver 181 and the second touch driver 182.

The touch coordinate calculator 190 receives touch raw data TRD from the touch driver 180. The touch coordinate calculator 190 calculates touch coordinates in accordance with a touch coordinate calculating method and outputs touch coordinate data HIDxy including information of touch coordinates to the host system 170.

The touch coordinate calculator 190 may be realized as a Micro Controller Unit (MCU). The host system 170 analyzes touch coordinate data HIDxy input from the touch coordinate calculator 190 and executes an application program connected with a coordinate where a touch is generated by a user. The host system 170 transmits the digital video data DATA and the timing signals to the timing controller 160 in accordance with the executed application program.

The touch driver 180 may be included in the source drive ICs 131 or may be fabricated of a separate drive chip and packaged onto the circuit board 150. Also, the touch coordinate calculator 190 may be fabricated of a driving chip and packaged onto the circuit board 150 FIG. 3 is a cross-sectional view briefly illustrating one side of a display panel in FIG. 1.

Figure 3:
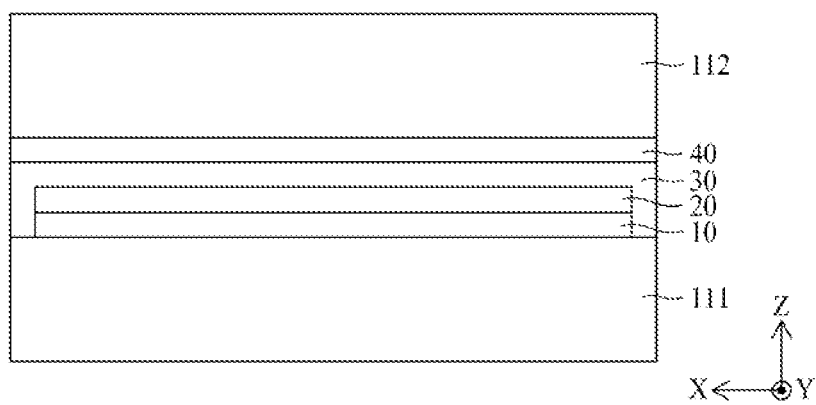
FIG. 3 is a cross-sectional view briefly illustrating one side of a display panel in FIG. 1.

Referring to FIG. 3, the display panel 110 may include a first substrate 111, a second substrate 112, a thin film transistor layer 10 arranged between the first and second substrates 111 and 112, an organic light emitting diode layer 20, an encapsulation layer 30, and a touch sensing layer 40.

The first substrate 111 may be a plastic film or a glass substrate.

The thin film transistor layer 10 is formed on the first substrate 111. The thin film transistor layer 10 may include scan lines, data lines, and thin film transistors. Each of the thin film transistors includes a gate electrode, a semiconductor layer, source and drain electrodes. In the case that a scan driver is formed using a GIP (gate driver in panel) method, the scan driver may be formed together with the thin film transistor layer 10.

The organic light emitting diode layer 20 is formed on the thin film transistor 10. The organic light emitting diode layer 20 includes first electrodes, an organic light emitting layer, a second electrode, and banks. Each of the organic light emitting layers may include a hole transporting layer, an organic light emitting layer, and an electron transporting layer. In this case, when a voltage is applied to the first electrode and the second electrode, holes and electrons are moved to the light emitting layer through the hole transporting layer and the electron transporting layer, respectively and are combined in the organic light emitting layer, thereby emitting light. Since pixels P are arranged on the area where the organic light emitting diode layer 20 is arranged, the area where the organic light emitting diode layer 20 is arranged may be defined as the display area. An area in the periphery of the display area may be defined as the non-display area.

The encapsulation layer 30 is formed on the organic light emitting diode layer 20. The encapsulation layer 30 serves to prevent oxygen and water from being permeated into the organic light emitting diode layer 20. The encapsulation layer 30 may include at least one inorganic film.

The touch sensing layer 40 is formed on the encapsulation layer 30. The touch sensing layer 40 includes first and the second touch electrodes for sensing a touch of a user, and may include bridge electrodes for electrically connecting the first touch electrodes or the second touch electrodes. It may also be said that the touch line of the touch sensing layer is disposed on a side surface of the encapsulation layer. It may also be said that "side surface" refers to an upright or sloping surface portion of a layer in a direction substantially perpendicular to, or at a non-zero angle with respect to, the top and bottom surfaces of a layer.

Hereafter, the encapsulation layer 30 and the touch sensing layer 40 according to the first embodiment of the present disclosure will be described in more detail with reference to FIGS. 4 to 9.

Figure 4:
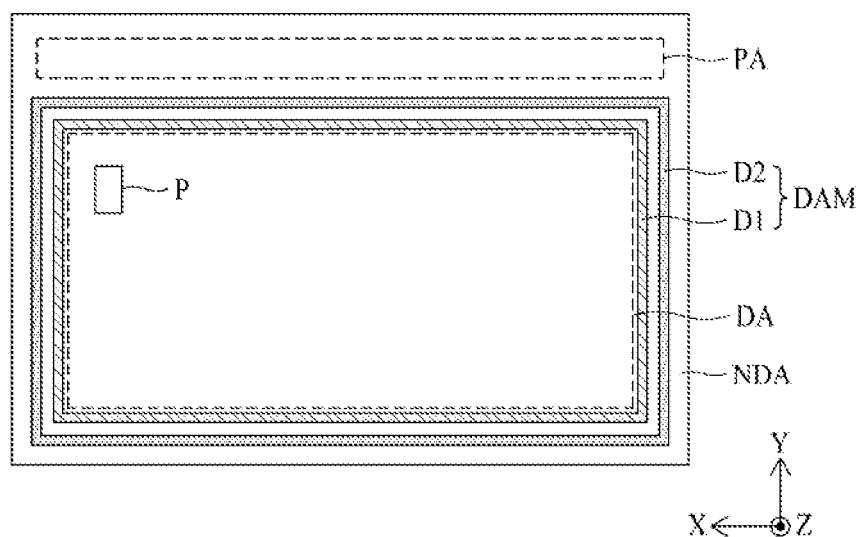
FIG. 4 is a plane view briefly illustrating a first substrate according to one embodiment of the present disclosure.
Figure 5:
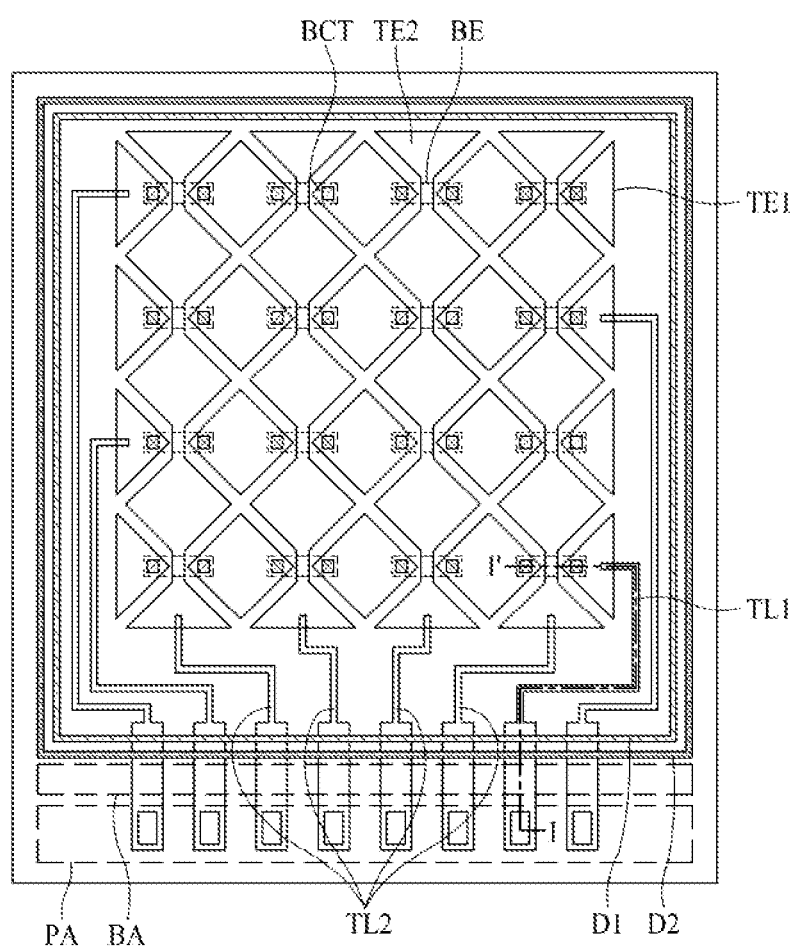
FIG. 5 is a plane view illustrating a touch sensing layer arranged on the first substrate.
Figure 6:
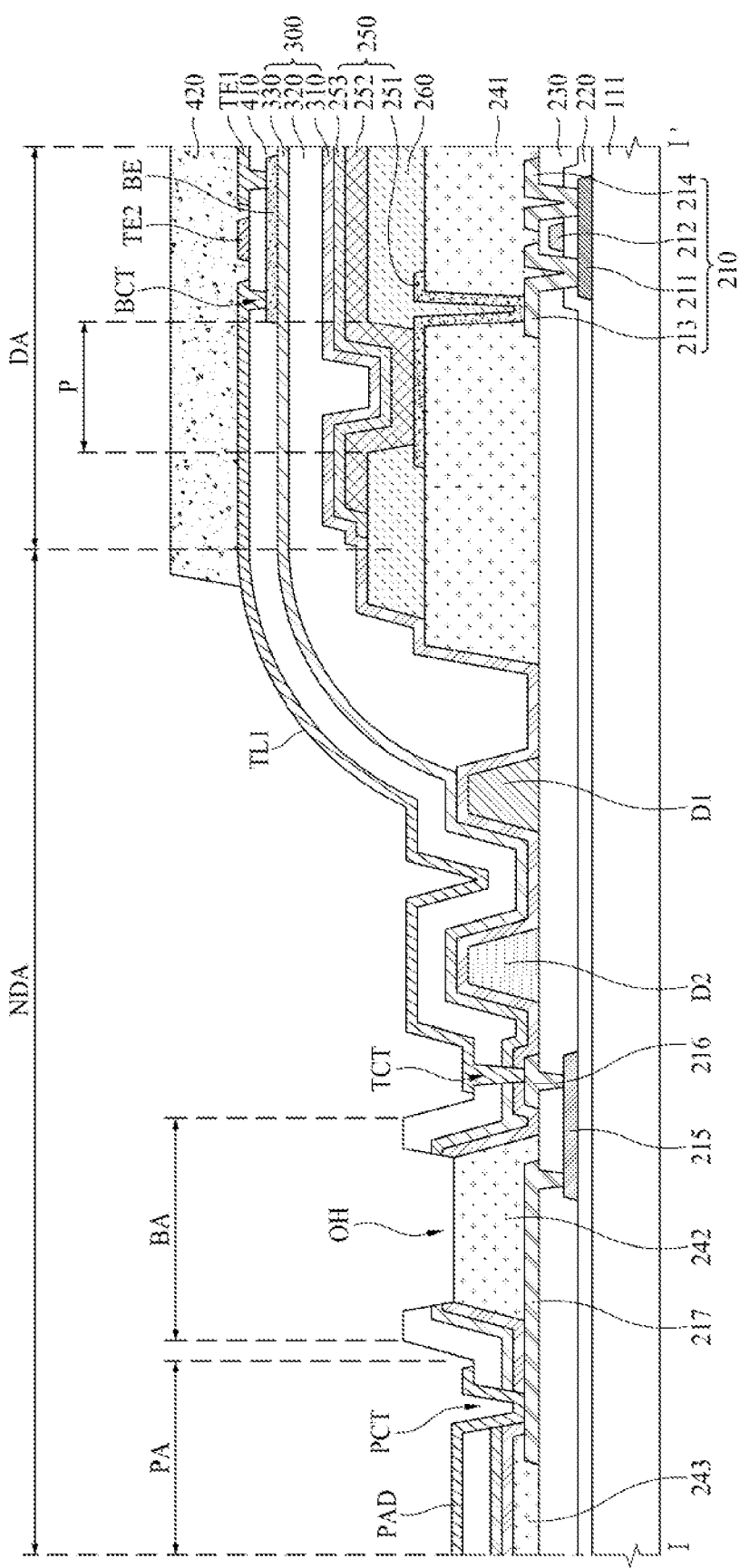
FIG. 6 is a cross-sectional view illustrating an example taken along line I-I' of FIG. 5.

FIG. 4 is a plane view briefly illustrating a first substrate according to one embodiment of the present disclosure, FIG. 5 is a plane view illustrating a touch sensing layer arranged on the first substrate, FIG. 6 is a cross-sectional view illustrating a display device according to one embodiment of the present disclosure, illustrating an example taken along line I-I' of FIG. 5.

Referring to FIGS. 4 to 6, the first substrate 111 is categorized into a display area DA and a non-display area NDA, wherein pixels P are arranged on the display area DA. The non-display area NDA surrounds the display area DA, and is provided with a dam DAM, and is also provided with a pad area PA where a bending area BA and pad electrodes PAD are formed outside the dam DAM. It may be said that a DAM is a barrier structure for preventing a material, such as the organic film layer, from flowing or spreading.

The thin film transistor layer 10 and the organic light emitting diode layer 20 are formed on the first substrate 111.

The thin film transistor layer 10 includes thin film transistors 210, a gate insulating film 220, an inter-layer dielectric film 230, and a planarization film 241.

A buffer film may be arranged on one surface of the first substrate 111. The buffer film may be formed on one surface of the first substrate 111 to protect the thin film transistors 210 and light emitting diodes 260 from water permeated through the first substrate 111 which is vulnerable to moisture permeability. One surface of the first substrate 111 may be a surface facing the second substrate 112. The buffer film may be made of a plurality of inorganic films which are deposited alternately. For example, the buffer film may be formed of a multi-layered film of one or more inorganic films of a silicon oxide film (SiOx), a silicon nitride film (SiNx) and SiON, which are deposited alternately. The buffer film may be omitted.

The thin film transistor 210 is arranged on the buffer film. The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 6, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The active layer 211 is arranged on the first substrate 111. The active layer 211 may be formed of a silicon based semiconductor material or an oxide based semiconductor material. A light-shielding layer for shielding external light entering the active layer 211 may be formed between the first substrate 111 and the active layer 211.

The gate insulating film 220 may be arranged on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212 and the first connection line 215 may be arranged on the gate insulating film 220. The first connection line 215 is arranged to be spaced apart from the gate electrode 212 on the non-display area NDA. The gate electrode 212 and the first connection line 215 may be formed of a single layer or multi-layer comprised of any one of Mo, Al, Cr, Au, Ti, Ni, Nd and Cu or their alloy.

The inter-layer dielectric film 230 may be arranged on the gate electrode 212 and the first connection line 215. The inter-layer dielectric film 230 may be formed of an inorganic film, for example, a silicon oxide film (SiOx), a silicon nitride film (SiNx), or a multi-layered film of the silicon oxide film and the silicon nitride film.

The source electrode 213, the drain electrode 214, a second connection line 216 and a third connection line 217 may be arranged on the inter-layer dielectric film 230. Each of the source electrode 213 and the drain electrode 214 may be connected to the active layer 211 through a contact hole that passes through the gate insulating film 220 and the inter-layer dielectric film 230. Also, the second connection line 216 and the third connection line 217 are arranged on the non-display area NDA, and may be connected to the first connection line 215 through a contact hole that passes through the inter-layer dielectric film 230. The source electrode 213, the drain electrode 214, the second connection line 216 and the third connection line 217 may be formed of a single layer or multi-layer comprised of any one of Mo, Al, Cr, Au, Ti, Ni, Nd and Cu or their alloy.

A passivation film may be formed on the source electrode 213 and the drain electrode 214 to insulate the thin film transistor 210. The passivation film may be formed of an inorganic film, for example, a silicon oxide film (SiOx), a silicon nitride film (SiNx), or a multi-layered film of the silicon oxide film and the silicon nitride film. This passivation film may be omitted.

The planarization film 241 for planarizing a step difference due to the thin film transistor 210 may be arranged on the source electrode 213 and the drain electrode 214. Also, an organic pattern 242 and a line protective film 243 are arranged on the third connection line 217. It may be said that the organic pattern is bendable within the bending area. Further, the organic pattern may alternatively be a bending film.

The organic pattern 242 is arranged between the dam DAM and the pad electrode PAD, and may be arranged to partially an upper portion of the third connection line 217. The organic pattern 242 prevents the third connection line 217 in the bending area BA where the first substrate 111 is bent from being externally exposed and serves to protect the third connection line 217. Also, the organic pattern 242 is provided with an open hole OH of which upper portion is exposed. That is, organic films, which may be arranged on the organic pattern 242, for example, the first inorganic film 310, the second inorganic film 330 and the insulating film 410 are removed. If the inorganic film is arranged on the organic pattern 242, a crack may be generated in the inorganic film when the bending area BA is bent. Since water may be permeated into the inorganic film where a crack is generated, the inorganic films provided on the organic pattern 242 are removed.

The line protective film 243 is arranged to surround an end of the third connection line 217. The line protective film 243 protects the end of the third connection line 217 arranged at an edge of the non-display area NDA.

The organic pattern 242 and the line protective film 243 are arranged on the same layer as the planarization film 241, and may be made of the same material. The planarization film 241, the organic pattern 242 and the line protective film 243 may be formed of an organic film such as acrylic resin, epoxy resin, phenolic resin, polyamide resin, and polyimide resin.

The organic light emitting diode layer 20 is arranged on the thin film transistor layer 10. The organic light emitting diode layer 20 includes an organic light emitting diode 250 and a bank 260.

The organic light emitting diode 250 and the bank 260 are arranged on the planarization film 241. The organic light emitting diode 250 includes the first electrode 251, the organic light emitting layer 252, and the second electrode 253. The first electrode 251 may be an anode electrode, and the second electrode 253 may be a cathode electrode.

The first electrode 251 may be formed on the planarization film 241. The first electrode 251 may be connected to the source electrode 213 of the thin film transistor 210 through a contact hole that passes through the passivation film and the planarization film 241. The first electrode 251 may be formed of conductive material with high reflexibility such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

In order to partition pixels P, the bank 260 may be arranged on the planarization film 241 to cover an edge of the first electrode 251. That is, the bank 260 serves as a pixel defining film for defining pixels P. The bank 260 may be formed of an organic film such as acrylic resin, epoxy resin, phenolic resin, polyamide resin, and polyimide resin.

The organic light emitting layer 252 is arranged on the first electrode 251 and the bank 260. The organic light emitting layer 252 may include a hole transporting layer, at least one light emitting layer, and an electron transporting layer. In this case, when a voltage is applied to the first electrode 251 and the second electrode 253, holes and electrons are moved to the light emitting layer through the hole transporting layer and the electron transporting layer, respectively, and are combined in the organic light emitting layer to emit light.

The organic light emitting layer 252 may be formed of a white light emitting layer for emitting white light. In this case, the organic light emitting layer 252 may be arranged to cover the first electrode 251 and the bank 260. In this case, a color filter (not shown) may be formed on the second substrate 112.

Otherwise, the organic light emitting layer 252 may be formed of a red light emitting layer for emitting red light, a green light emitting layer for emitting green light, and a blue light emitting layer for emitting blue light. In this case, the organic light emitting layer 252 may be arranged on the area corresponding to the first electrode 251 and a color filter may not be arranged on the second substrate 112.

The second electrode 253 is arranged on the organic light emitting layer 252. In the case that the organic light emitting display device is formed in a top emission structure, the second electrode 253 may be formed of a transparent conductive material (TCO) such as ITO and IZO, which may transmit light, or a semi-transmissive conductive material such as Mg, Ag, and alloy of Mg and Ag. A capping layer may be arranged on the second electrode 253.

On the organic light emitting diode layer 20, the encapsulation layer 30 is formed not only on the display area DA but also on the non-display area NDA. The encapsulation layer 30 includes a dam DAM and an encapsulation film 300.

The dam DAM is arranged on the non-display area NDA and blocks a flow of an organic film 320 constituting the encapsulation film 300. In more detail, the dam DAM is arranged to surround the outside of the display area DA and blocks a flow of the organic film 320 constituting the encapsulation film 300. The dam DAM may also be arranged on the non-display area NDA to block the flow of the organic film 320, thereby allowing the organic film 320 constituting the encapsulation film 300 not to be permeated into the pad electrode PAD. Therefore, the dam DAM may prevent the organic film 320 from being exposed to the outside of the display device or from being permeated into the pad electrode PAD.

Such a dam DAM may include a first dam D1 and a second dam D2.

The first dam D1 may be arranged to surround the outside of the display area DA to primarily block the flow of the organic film 320 constituting the encapsulation film 300. Also, the first dam D1 may be arranged between the display area DA and the pad area PA to primarily block the flow of the organic film 320 by preventing the organic film 320 from being permeated into the exposed pad area PA.

The second dam D2 is arranged to surround the outside of the first dam D1, and is spaced apart from the first dam D1 and arranged in parallel with the first dam D1. The second dam D2 may secondarily block the flow of the organic film 320 toward the outside of the first dam D1. Therefore, the first dam D1 and the second dam D2 may more effectively prevent the organic film 320 from being exposed to the outside of the display device or from being permeated into the exposed pad area PA. It may also be said that the dams are arranged on a routing area, the routing area being between the touch electrodes and the pad and bending areas of the display.

Such a dam DAM may be formed simultaneously with the planarization film 241 or the bank 260 and formed of the same material as that of the planarization film 241 or the bank 260. In this case, the dam DAM may be formed of an organic film such as acrylic resin, epoxy resin, phenolic resin, polyamide resin, and polyimide resin.

The encapsulation film 300 serves to prevent oxygen or water from being permeated into the organic light emitting layer 252 and the second electrode 253. To this end, the encapsulation film 300 may include at least one inorganic film and at least one organic film. For example, the encapsulation film 300 may include a first inorganic film 310, the organic film 320, and a second inorganic film 330.

The first inorganic film 310 is arranged on the second electrode 253. The first inorganic film 310 is arranged to cover the second electrode 253. The first inorganic film 310 according to one embodiment of the present disclosure covers the second electrode 253 and is extend to the non-display area NDA to cover the dam DAM. Also, the first inorganic film 310 according to one embodiment of the present disclosure is extended to the pad area PA arranged outside the dam DAM and overlapped with the pad electrode PAD. It may be said that elements that are "overlapped" refers to any element that extends over another element, but it also may refer generally to an element that is on a different layer to another element, and extends above or below said another element. For example, a first film underneath a second film may also be considered to overlap the second film.

In the display device 100 according to one embodiment of the present disclosure, since the first inorganic film 310 is extended to the pad area PA, it is not required to arrange a mask for covering the pad area PA so as not to form the first inorganic film 310 on the pad area PA. Therefore, in the display device 100 according to one embodiment of the present disclosure, a mask is not arranged on the pad area PA to prevent arcing from being generated between a boundary surface of the mask and the pad electrode PAD arranged on the pad area PA or the metal line such as the third connection line 217 and prevent a defect from being generated due to a high current from the mask, which flows into the display device along the metal line.

The organic film 320 is arranged on the first inorganic film 310. The organic film 320 may be formed with a sufficient thickness to prevent particles from being permeated into the organic light emitting layer 252 and the second electrode 253 by passing through the first inorganic film 310. The organic film 320 may be formed by a hardening process after being deposited in a liquid type through an inkjet process.

The second inorganic film 330 is arranged on the organic film 320. The second inorganic film 330 is arranged to cover the organic film 320. The second inorganic film 330 according to one embodiment of the present disclosure covers the organic film 320 and may be extended to the non-display area NDA to cover the dam DAM. Also, the first inorganic film 310 according to one embodiment of the present disclosure is extended to the pad area PA arranged outside the dam DAM and overlapped with the pad electrode PAD. At this time, the first inorganic film 310 and the second inorganic film 330 according to one embodiment of the present disclosure may be formed to have their ends of the same position. It may also be said that an end of the first inorganic film and an end of the second inorganic film are in line with each other. It may also be said that film ends "in line with each other" refer to film ends that extend above or below each other and terminate at a similar point, one end not extending beyond the other.

In the display device 100 according to one embodiment of the present disclosure, since the second inorganic film 330 is extended to the pad area PA, it is not required to arrange a mask for covering the pad area PA so as not to form the second inorganic film 330 on the pad area PA. Therefore, in the display device 100 according to one embodiment of the present disclosure, a mask is not arranged on the pad area PA to prevent arcing from being generated between a boundary surface of the mask and the pad electrode PAD arranged on the pad area PA or the metal line such as the third connection line 217 and prevent a defect from being generated due to a high current from the mask, which flows into the display device along the metal line.

Also, in the display device 100 according to one embodiment of the present disclosure, since the first inorganic film 310 is formed on the pad area PA, arcing is not generated between the boundary surface of the mask and the pad electrode PAD arranged on the pad area PA or the metal line such as the third connection line 217 even though the mask is arranged on the pad area PA. That is, the first inorganic film 310 may serve as an insulating film. In this way, in the display device 100 according to one embodiment of the present disclosure, since the first inorganic film 310 formed to reach the pad area PA serves as an insulating film, arcing is not generated even though the mask is arranged on the pad area PA during a manufacturing process of the second inorganic film 330.

Each of the first and second inorganic films 310 and 330 may be formed of a silicon nitride, an aluminum nitride, a zirconium nitride, a titanium nitride, a hafnium nitride, a tantalum nitride, a silicon oxide, an aluminum oxide, or a titanium oxide. The organic film 320 may be formed of acrylic resin, epoxy resin, phenolic resin, polyamide resin, or polyimide resin.

The touch sensing layer 40 is formed on the encapsulation layer 30. The touch sensing layer 40 includes bridge electrodes BE, an insulating film 410, first touch electrodes TE1, second touch electrodes TE2, a pad electrode PAD, and a passivation film 420.

In the display device 100 according to one embodiment of the present disclosure, the bridge electrode BE is formed on the encapsulation film 300, and no inorganic film is formed between the encapsulation film 300 and the bridge electrode BE. In the related art, a buffer layer is formed on the encapsulation film 300 to protect the pad electrode PAD or the metal line exposed when the bridge electrode BE is formed. However, in the display device 100 according to one embodiment of the present disclosure, since the metal line such as the third connection line 217 is not exposed by the first inorganic film 310 and the second inorganic film 330 when the bridge electrode BE is formed, it is not required to form the buffer layer. Therefore, in the display device 100 according to one embodiment of the present disclosure, the buffer layer is omitted, whereby the manufacturing cost may be reduced and the process may be reduced.

The bridge electrode BE is formed on the second inorganic film 330. In order to prevent the first touch electrodes TE1 and the second touch electrodes TE2 from short-circuiting at their crossing areas, the bridge electrode BE electrically connects the first touch electrodes TE1 adjacent to each other in a first direction. The bridge electrode BE is formed on a different layer from the first and second touch electrodes TE1 and TE2, and may be connected to the first touch electrodes TE1 adjacent to each other through bridge contact holes BCT. The bridge electrode BE may cross the second touch electrode TE2.

The insulating film 410 is arranged on the bridge electrode BE. The insulating film 410 is arranged to cover the bridge electrode BE, thereby insulating the bridge electrode BE from the first and second touch electrodes TE1 and TE2. The insulating film 410 according to one embodiment of the present disclosure covers the bridge electrode BE, and is extended to the non-display area NDA, whereby the insulating film may be formed to reach the pad area PA. Also, the insulating film 410 according to one embodiment of the present disclosure may be extended to the pad area PA arranged outside the dam DAM.

In the display device 100 according to one embodiment of the present disclosure, since the insulating film 410 is extended to the pad area PA, it is not required to arrange a mask for covering the pad electrode PAD on the pad electrode PAD so as not to form the insulating film 410 on the pad area PA.

The first inorganic film 310, the second inorganic film 330 and the insulating film 410 formed on the third connection line 217 may be removed simultaneously during the process of forming the bridge contact hole BCT. That is, the bridge contact hole BCT and the pad contact hole PCT may be formed at the same time.

The first touch electrodes TE1 and the second touch electrodes TE2 are arranged on the insulating film 410. The first touch electrodes TE1, the second touch electrodes TE2, the first touch lines TL1 and the second touch lines TL may be arranged on the same layer. The first touch electrodes TE1 are arranged in a first direction (y-axis direction) and connected to each other, and the second touch electrodes TE2 are arranged in a second direction (x-axis direction) and connected to each other. The first direction (y-axis direction) may be parallel with the scan lines S1 to Sn, and the second direction (x-axis direction) may be parallel with the data lines DL1 to DLm. Alternatively, the first direction (y-axis direction) may be parallel with the data lines DL1 to DLm, and the second direction (x-axis direction) may be parallel with the scan lines S1 to Sn.

Each of the first touch electrodes TE1 connected in the first direction (y-axis direction) is electrically insulated from the first touch electrodes TE1 adjacent thereto in the second direction (x-axis direction). Each of the second touch electrodes TE2 connected in the second direction (x-axis direction) is electrically insulated from the second touch electrodes TE2 adjacent thereto in the first direction (y-axis direction).

For this reason, mutual capacitance corresponding to the touch sensor may be formed on the crossed area of the first touch electrode TE1 and the second touch electrode TE2.

Among the first touch electrodes TE1 connected with each other in the first direction (y-axis direction), the first touch electrode TE arranged at one end may be connected to the first touch line TL1 on the non-display area NDA. The first touch line TL1 may be extended from the first touch electrode TE1 and then patterned to reach the non-display area NDA. In more detail, the first touch line TL1 according to one embodiment of the present disclosure is formed on the encapsulation film 300, extended to the upper portion of the dam DAM, and electrically connected with the second connection line 216 arranged at a lower portion, by a touch contact hole TCT. That is, the first touch line TL1 according to one embodiment of the present disclosure is not formed on the bending area BA. The first touch line TL1 may electrically be connected from the first source-drain line 216, the first connection line 215 and the third connection line 217 to the pad electrode PAD and then connected to the first touch driver 181 through the pad electrode PAD. Therefore, the first touch electrodes TE1 connected with each other in the first direction (y-axis direction) may receive a driving pulse from the first touch driver 181 through the first touch line TL1.

Among the second touch electrodes TE2 connected with each other in the second direction (x-axis direction), the second touch electrode TE2 arranged at one end may be connected to the second touch line TL2 on the non-display area NDA. The second touch line TL2 may be extended from the second touch electrode TE2 and then patterned to reach the non-display area NDA. In more detail, the second touch line TL2 according to one embodiment of the present disclosure is formed on the encapsulation film 300, extended to the upper portion of the dam DAM, and electrically connected with the second connection line 216 arranged at a lower portion, by a touch contact hole TCT. That is, the second touch line TL2 according to one embodiment of the present disclosure is not formed on the bending area BA. The second touch line TL2 may electrically be connected from the second connection line 216, the first connection line 215 and the third connection line 217 to the pad electrode PAD and then connected to the second touch driver 182 through the pad electrode PAD. Therefore, the second touch driver 182 may receive the amount of charge changes in the touch sensors of the second touch electrodes TE2 connected with each other in the second direction (x-axis direction).

The pad electrode PAD is arranged on the pad area PA arranged outside the dam DAM and the bending area BA. In more detail, the pad electrode PAD according to one embodiment of the present disclosure may be arranged on the second-source drain line 217, the line protective film 243, the first inorganic film 310, the second inorganic film 330 and the insulating film 410 and overlapped with the first inorganic film 310 and the second inorganic film 330. In the display device 100 according to one embodiment of the present disclosure, in order to prevent the metal line on the bending area BA from being externally exposed, the pad electrode PAD is electrically connected with the third connection line 217 through a pad contact hole that passes through the first inorganic film 310, the second inorganic film 330 and the insulating film 410.

The passivation film 420 is arranged on the first touch electrodes TE1 and the second touch electrodes TE2. The passivation film 420 maintains characteristic stabilization of the display device by blocking a harmful environment from the outside. Also, the passivation film 420 may be formed not only on the first touch electrodes TE1 and the second touch electrodes TE2 but also between the first touch electrodes TE1 and the second touch electrodes TE2. Each of the first touch electrodes TE1 may be insulated from each of the second touch electrodes TE2 by the passivation film 420.

According to the embodiment of the present disclosure, since the touch sensing layer 40 is directly formed on the encapsulation layer 30, it is not required to align the first substrate 111 and the second substrate 112 when the first substrate 111 and the second substrate 112 are bonded to each other.

As described above, in the display device 100 according to one embodiment of the present disclosure, since the first inorganic film 310 is extended to the pad area PA, it is not required to arrange a mask for covering the pad area PA on the pad area PA so as not to form the first inorganic film 310 on the pad area PA.

Therefore, in the display device 100 according to one embodiment of the present disclosure, a mask is not arranged on the pad area PA to prevent arcing from being generated between a boundary surface of the mask and the pad electrode PAD arranged on the pad area PA or the metal line such as the third connection line 217 and prevent a defect from being generated due to a high current from the mask, which flows into the display device along the metal line.

Also, in the display device 100 according to one embodiment of the present disclosure, since the first inorganic film 310 formed to reach the pad area PA serves as an insulating film, arcing is not generated even though the mask is arranged on the pad area PA during a manufacturing process of the second inorganic film 330.

In the display device 100 according to one embodiment of the present disclosure, since the metal line such as the third connection line 217 is not exposed by the first inorganic film 310 and the second inorganic film 330 when the bridge electrode BE is formed, it is not required to form the buffer layer. Therefore, in the display device 100 according to one embodiment of the present disclosure, the buffer layer is omitted, whereby the manufacturing cost may be reduced and the process may be reduced.

Figure 7:
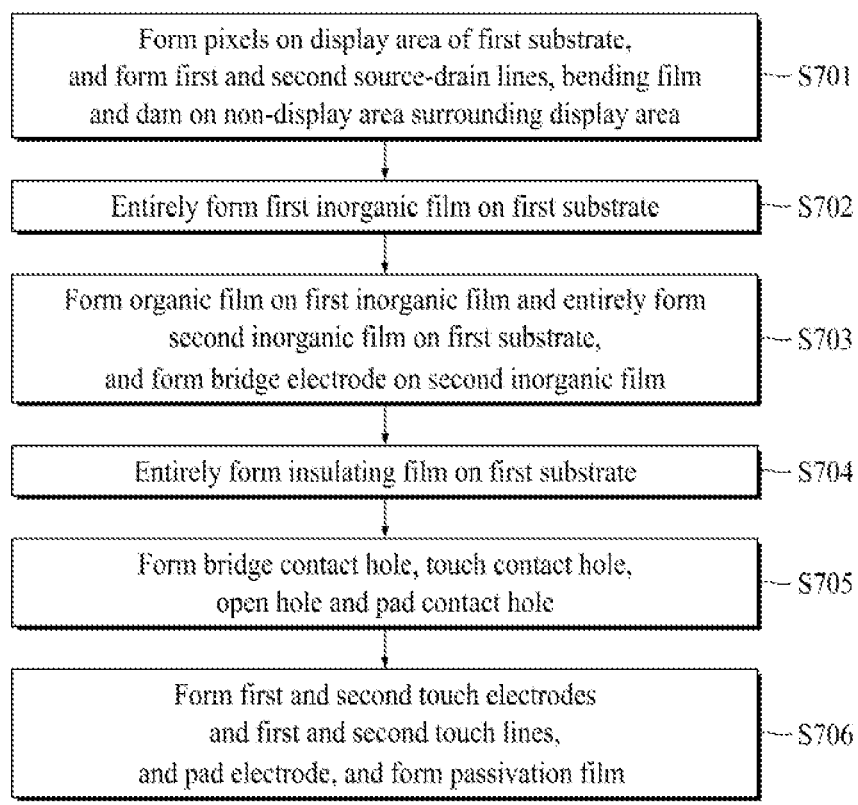
FIG. 7 is a flow chart illustrating a method of manufacturing a display device according to one embodiment of the present disclosure.

FIG. 7 is a flow chart illustrating a method of manufacturing a display device according to one embodiment of the present disclosure, and FIGS. 8A to 8F are cross-sectional views illustrating a method of manufacturing a display device according to one embodiment of the present disclosure.

FIGS. 8A to 8F relate to a method of manufacturing a display device according to one embodiment of the present disclosure shown in FIG. 6, and the same reference numerals are given to the same elements as those of FIG. 6. Hereinafter, the method of manufacturing a display device according to one embodiment of the present disclosure will be described with reference to FIG. 7 and FIGS. 8A to 8F.

Figure 8A:
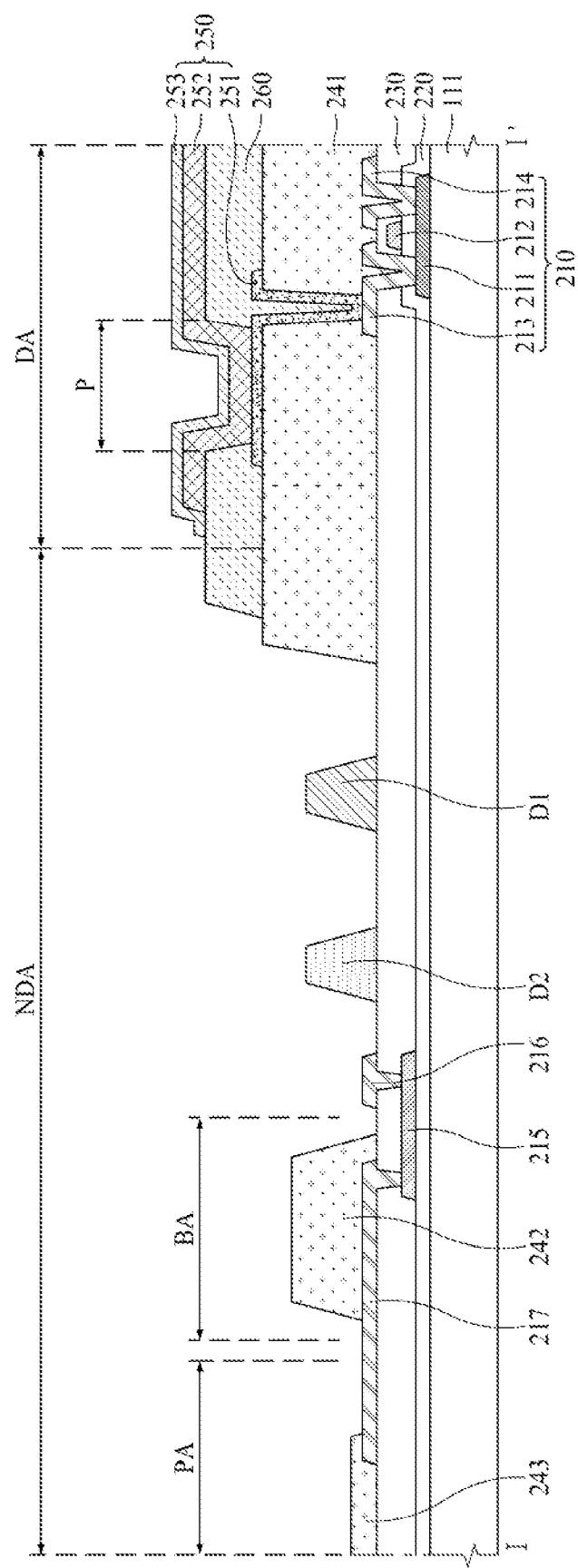
FIGS. 8A to 8F are cross-sectional views illustrating a method of manufacturing a display device according to one embodiment of the present disclosure.

First of all, as shown in FIG. 8A, pixels P are formed on the display area DA, and second and third connection 216 and 217, an organic pattern 242 and a dam DAM are formed on the non-display area NDA surrounding the display area DA (S701).

In more detail, an active layer 211 of a thin film transistor 210 is formed on a first substrate 111. In more detail, an active metal layer is formed on the entire surface of the first substrate 111 by a sputtering method or a MOCVD (Metal Organic Chemical Vapor Deposition) method. Then, the active metal layer is patterned by a mask process using a photoresist pattern to form the active layer 211. The active layer 211 may be formed of a silicon based semiconductor material or an oxide based semiconductor material.

Then, a gate insulating film 220 is formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

Then, a gate electrode 212 of the thin film transistor 210 and a first connection line 215 are formed on the gate insulating film 220. Specifically, a first metal layer is formed on the entire surface of the gate insulating film 220 by a sputtering method or a MOCVD method. Then, the first metal layer is patterned by a mask process using a photoresist pattern to form the gate electrode 212 and the first connection line 215. The gate electrode 212 and the first connection line 212 may be formed of a single layer or multi-layer comprised of any one of Mo, Al, Cr, Au, Ti, Ni, Nd and Cu or their alloy.

Then, an inter-layer dielectric film 230 is formed on the gate electrode 212. The inter-layer dielectric film 230 may be formed of an inorganic film, for example, a silicon oxide film (SiOx), a silicon nitride film (SiNx), or a multi-layered film of the silicon oxide film and the silicon nitride film.

Then, contact holes for exposing the active layer 211 by passing through the gate insulating film 220 and the inter-layer dielectric film 230 and contact holes for exposing the first connection line 215 by passing through the inter-layer dielectric film 230 are formed.

Then, source and drain electrodes 213 and 214 and the second and third connection lines 216 and 217 of the thin film transistor 210 are formed on the inter-layer dielectric film 230. Specifically, a second metal layer is formed on the entire surface of on the inter-layer dielectric film 230 by a sputtering method or a MOCVD method. Then, the second metal layer is patterned by a mask process using a photoresist pattern to form the source and drain electrodes 213 and 214 and the second and third connection lines 216 and 217. Each of the source and drain electrodes 213 and 214 may be connected to the active layer 211 through contact holes that pass through the gate insulating film 220 and the inter-layer dielectric film 230. Also, the second and third connection lines 216 and 217 may be connected to the first connection line 215 through contact holes that pass through the inter-layer dielectric film 230. Each of the source and drain electrodes 213 and 214 and the second and third connection lines 216 and 217 may be formed of a single layer or multi-layer comprised of any one of Mo, Al, Cr, Au, Ti, Ni, Nd and Cu or their alloy.

Then, a planarization film 241 for planarizing a step difference due to the thin film transistor 210 is formed on the source and drain electrodes 213 and 214 of the thin film transistor 210. An organic pattern 242 and a line protective film 243 are arranged on the second and third connection lines 216 and 217. The planarization film 241, the organic pattern 242 and the line protective film 243 may be formed at the same time, and may be formed of an organic film such as acrylic resin, epoxy resin, phenolic resin, polyamide resin, and polyimide resin. Meanwhile, the line protective film 243 may be formed at a height lower than those of the planarization film 241 and the organic pattern 242.

Then, an organic light emitting diode 250 is formed on the planarization film 241. Specifically, a first electrode 251 of the organic light emitting diode 250 is formed on the planarization film 241. More specifically, a third metal layer is formed on the entire surface of the planarization film 241 using a sputtering method or a MOCVD method. Then, the third metal layer is patterned by a mask process using a photoresist pattern to form the first electrode 251. The first electrode 251 may be connected to the source electrode 213 of the thin film transistor 210 through a contact hole that passes through the planarization film 241. The first electrode 251 may be formed of a conductive material with high reflexibility such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO.

Then, in order to partition the pixels P, a bank 260 is formed on the planarization film 241 to cover an edge of the first electrode 251, and a dam DAM is also formed together with the bank 260. In this case, the dam DAM is formed on the non-display area NDA. Each of the dam DAM and the bank 260 may be formed of an organic film such as acrylic resin, epoxy resin, phenolic resin, polyamide resin, and polyimide resin.

Meanwhile, the dam DAM is formed simultaneously with the bank 260 but is not limited to this example. The dam DAM may be formed simultaneously with the planarization film 241.

Then, an organic light emitting layer 252 is formed on the first electrode 251 and the bank 260 by a deposition process or a solution process. Then, the second electrode 253 is formed on the organic light emitting layer 252. The second electrode 253 may be a common layer that is commonly formed on the pixels P. The second electrode 253 may be formed of a transparent conductive material (TCO) such as ITO and IZO, which may transmit light. The second electrode 253 may be formed by physics vapor deposition such as a sputtering method. A capping layer may be formed on the second electrode 253.

Figure 8B:
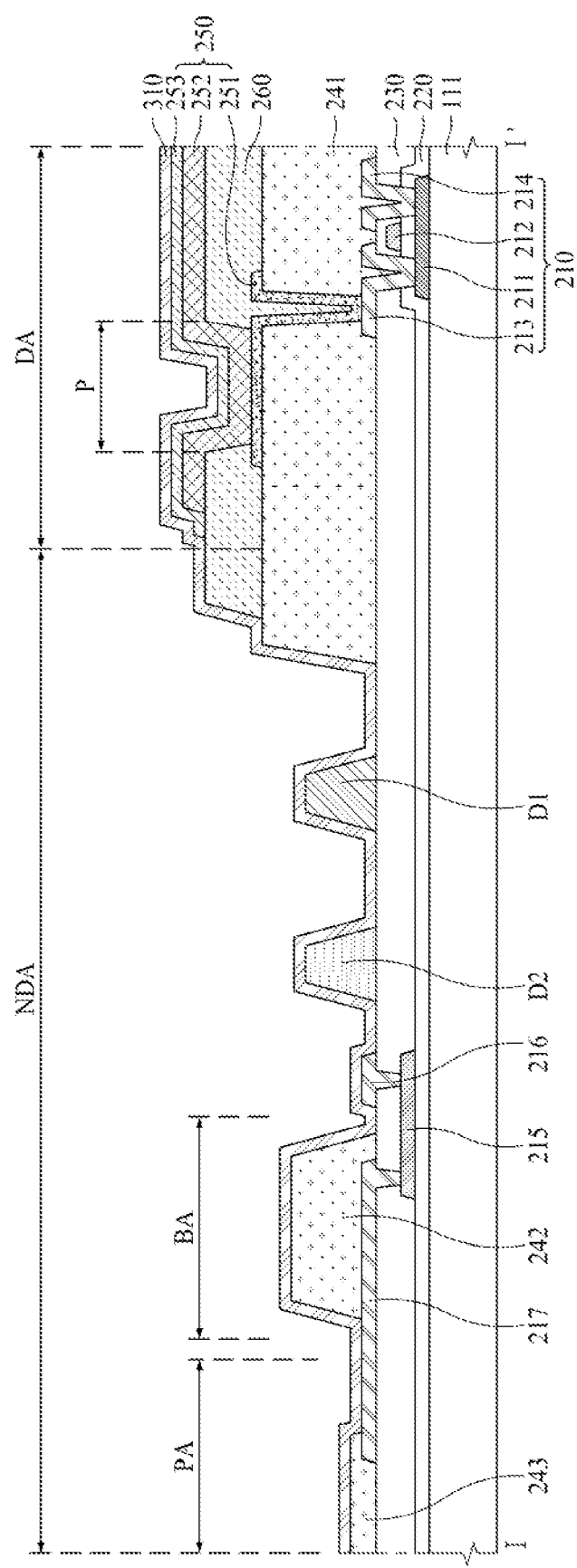

Secondly, as shown in FIG. 8B, a first inorganic film 310 is entirely formed on the first substrate 111 (S702).

The first inorganic film 310 according to one embodiment of the present disclosure covers the second electrode 253, and is extended to the non-display area NDA to cover the dam DAM and the third connection line 217. In the display device 100 according to one embodiment of the present disclosure, since the first inorganic film 310 is extended to the pad area PA, it is not required to arrange a mask for covering the pad area PA on the pad area PA so as not to form the first inorganic film 310 on the pad area PA. Therefore, in the display device 100 according to one embodiment of the present disclosure, a mask is not arranged on the pad area PA to prevent arcing from being generated between a boundary surface of the mask and the metal line and prevent a defect from being generated due to a high current from the mask, which flows into the display device.

Figure 8C:
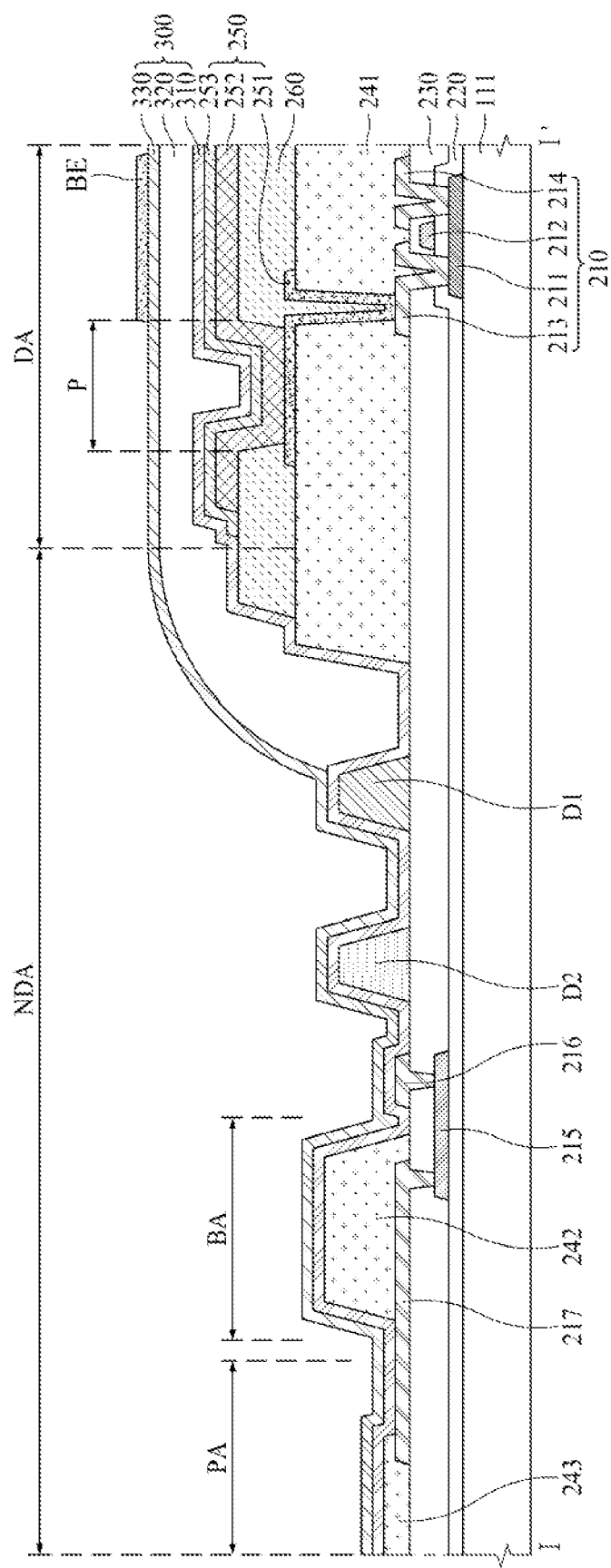

Thirdly, as shown in FIG. 8C, an organic film 320 is formed on the first inorganic film 310, a second inorganic film 330 is entirely formed on the first substrate 111, and a bridge electrode BE is formed on the second inorganic film 330 (S703).

The organic film 320 is formed to cover the first inorganic film 310. The organic film 320 is preferably formed with a sufficient thickness to prevent particles from being permeated into the organic light emitting layer 252 and the second electrode 253 by passing through the first inorganic film 310. The second inorganic film 330 is entirely formed on the first substrate 111 to cover the organic film 320.

Each of the first and second inorganic films 310 and 330 may be formed of a silicon oxide, a silicon nitride, a silicon oxynitride, an aluminum oxide, an aluminum nitride, a zirconium nitride, a titanium nitride, a hafnium nitride, a tantalum nitride, or a titanium oxide. The organic film 320 may be formed of acrylic resin, epoxy resin, phenolic resin, polyamide resin, or polyimide resin. Then, the bridge electrode BE is formed on the display area DA of the second inorganic film 330. At this time, the bridge electrode BE may be formed to, but not limited to, overlap the bank 260.

In the display device 100 according to one embodiment of the present disclosure, the buffer layer is not formed on the encapsulation film 300, and the bridge electrode BE is formed on the encapsulation film 300. In the related art, the buffer layer is formed on the encapsulation film 300 to protect the metal line exposed when the bridge electrode BE is formed. However, in the display device 100 according to one embodiment of the present disclosure, since the metal lines are not exposed by the first inorganic film 310 when the bridge electrode BE is formed, it is not required to form the buffer layer. Therefore, in the display device 100 according to one embodiment of the present disclosure, the buffer layer is omitted, whereby the manufacturing cost may be reduced and the process may be reduced.

According to the process of forming the bridge electrode BE, a fourth metal layer is formed on the entire surface of the second inorganic film 330 by a sputtering method or a MOCVD method. Then, the fourth metal layer is patterned by a mask process using a photoresist pattern to form the bridge electrode BE.

Figure 8D:
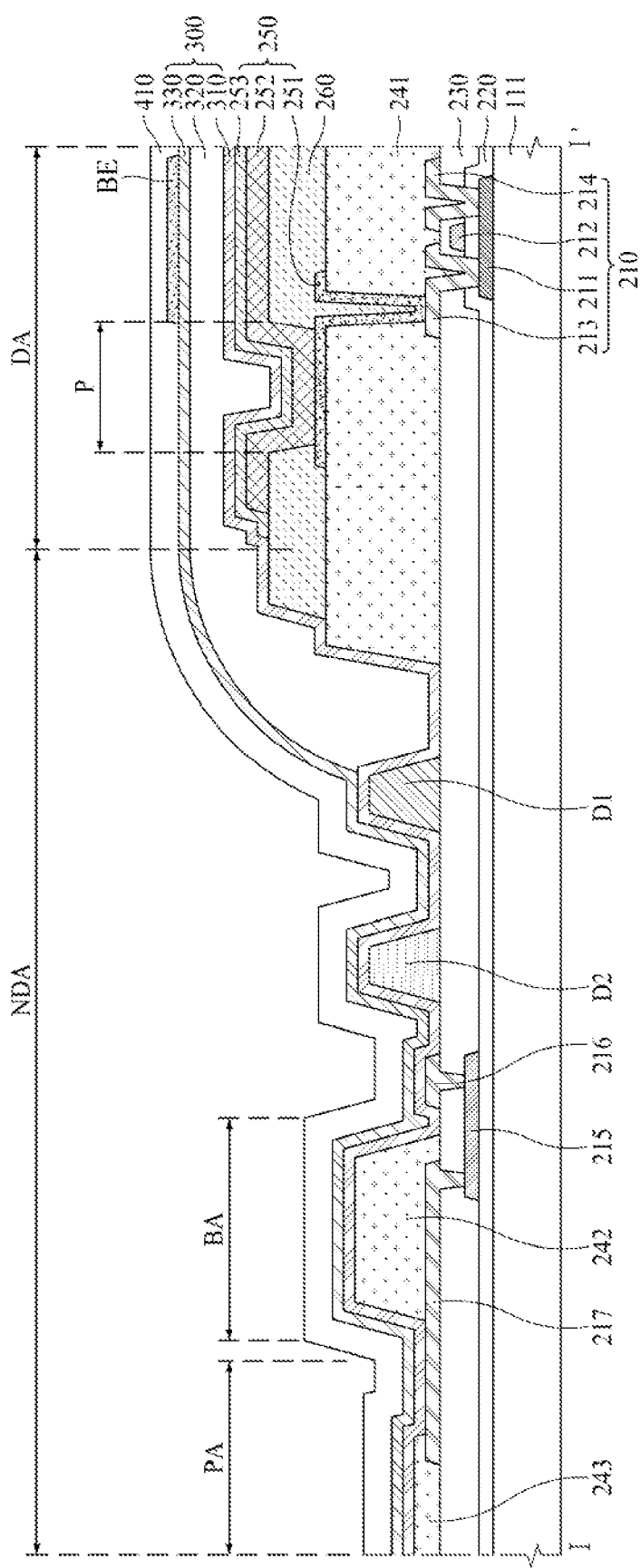

Fourthly, as shown in FIG. 8D, an insulating film 410 is entirely formed on the first substrate 111 (S704).

The insulating film 410 according to one embodiment of the present disclosure covers the bridge electrode BE, and is extended to the non-display area NDA to cover the dam DAM and the third connection line 217. In the display device 100 according to one embodiment of the present disclosure, since the insulating film 410 is extended to the pad area PA, it is not required to arrange a mask for covering the pad area PA on the pad area PA so as not to form the insulating film 410 on the pad area PA.

Figure 8E:
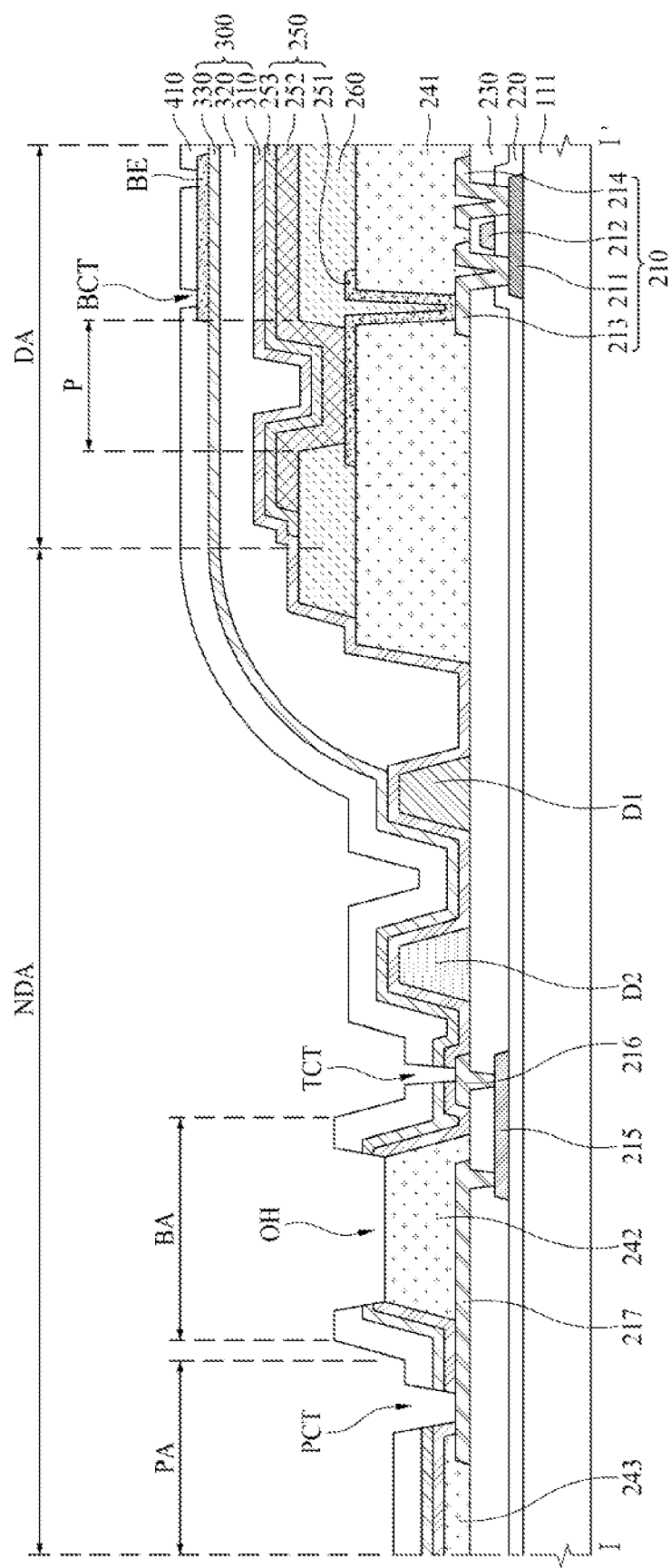

Fifthly, as shown in FIG. 8E, a bridge contact hole BCT, a touch contact hole TCT, an open hole OH, and a pad contact hole PCT are formed (S705).

The bridge contact hole BCT exposes the bridge electrode BE by passing through the insulating film 410. The touch contact hole TCT exposes the second connection line 216 by passing through the first and second inorganic films 310 and 330 and the insulating film 410. The open hole OH exposes the organic pattern 242 by passing through the first and second inorganic films 310 and 330 and the insulating film 410. The pad contact hole PCT exposes third connection line 217 by passing through the first and second inorganic films 310 and 330 and the insulating film 410. The bridge contact hole BCT, the touch contact hole TCT, the open hole OH, and the pad contact hole PCT may simultaneously be formed by an etching process.

The bridge electrode BE may be connected to first touch electrodes TE1 through the bridge contact hole BCT, which passes through the insulating film 410, to electrically connect the first touch electrodes TE1.

The first and second touch lines TL1 and TL2 may electrically be connected to the second connection line 216 through the touch contact hole TCT that passes through the first and second inorganic films 310 and 330 and the insulating film 410.

The pad electrode PAD may electrically be connected to the third connection line 217 through the pad contact hole PCT that passes through the first and second inorganic films 310 and 330 and the insulating film 410.

Figure 8F:
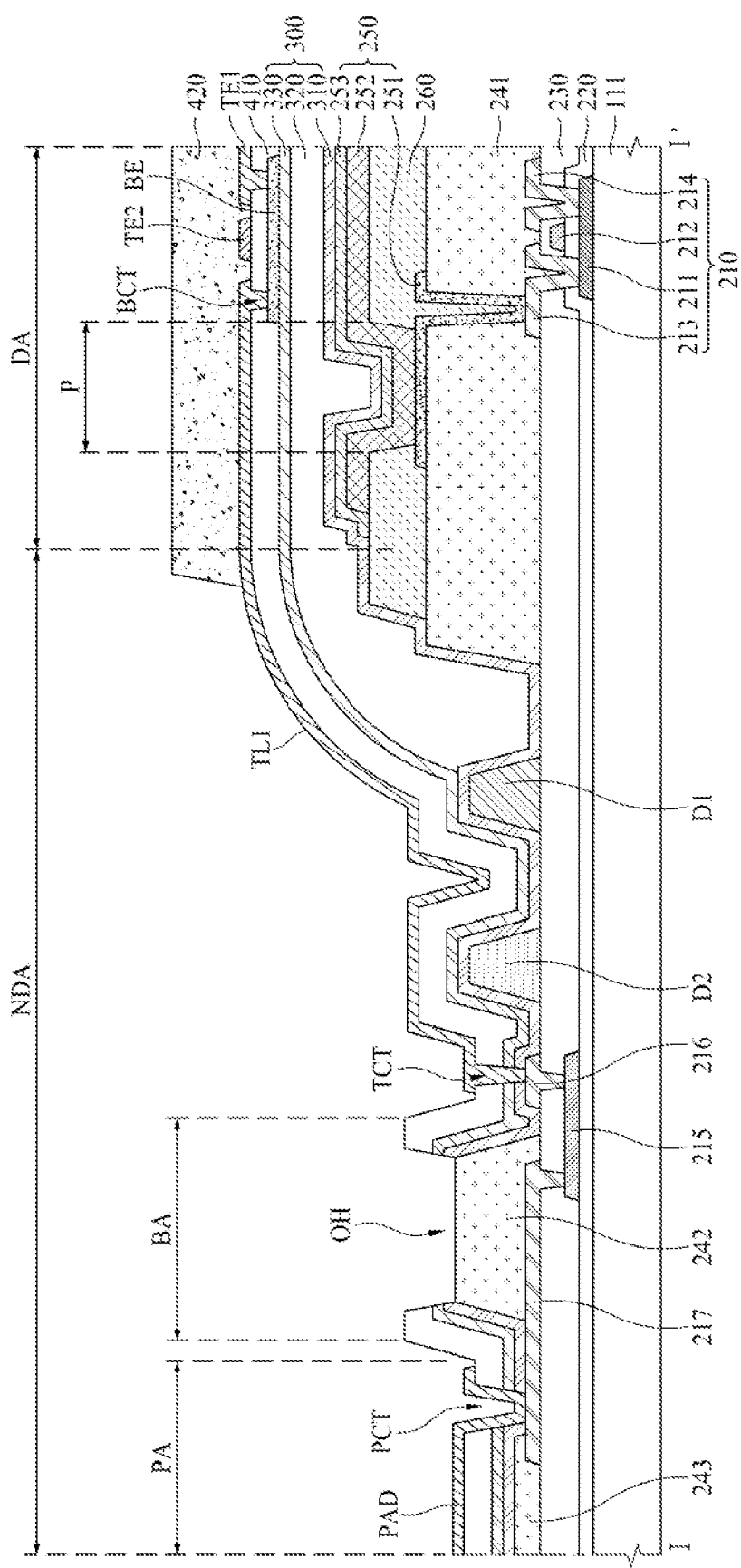

Sixthly, as shown in FIG. 8F, the first and second touch electrodes TE1 and TE2, the first and second touch lines TL1 and TL2 and the pad electrode PAD are formed, and the passivation film 420 is formed (S706).

In detail, the first touch electrodes TE1, the second touch electrodes TE2, the first and second touch lines TL1 and TL2 and the pad electrode PAD are formed on the insulating film 410. The first touch electrodes TE1 are arranged in a first direction to be spaced apart from each other at a constant space, and the second touch electrodes TE2 are arranged in a second direction to be connected to each other. In this case, each of the first touch electrodes TE1 and the second touch electrodes TE2 may have shapes of a rectangle, an octagon, a circle, or a rhombus.

Among the first touch electrodes TE1 connected with each other in the first direction, the first touch electrode TE1 arranged at one end may be connected to the first touch line TL1 on the non-display area NDA. The first touch line TL1 may be extended from the first touch electrode TE1 and then patterned to reach the upper portion of the dam DAM. The first touch electrode TE1, the first touch line TL1 and the pad electrode PAD may be formed on the same layer, and may be formed of the same material.

Among the second touch electrodes TE2 connected with each other in the second direction, the second touch electrode TE2 arranged at one end may be connected to the second touch line TL2 on the non-display area NDA. The second touch line TL2 may be extended from the second touch electrode TE2 and then patterned to reach the upper portion of the dam DAM. The second touch electrode TE2, the second touch line TL2 and the pad electrode PAD may be formed on the same layer, and may be formed of the same material.

The first touch electrodes TE1, the second touch electrodes TE2, the first touch lines TL1, and the second touch lines TL2 may be formed of a transparent conductive material (TCO) such as ITO and IZO, which may transmit light.

A fifth metal layer is formed on the entire surface of the insulating film 410 by a sputtering method or a MOCVD method. Then, the fifth metal layer is patterned by a mask process using a photoresist pattern to form the first touch electrodes TE1, the second touch electrodes TE2, the first touch lines TL1, the second touch lines TL2 and the pad electrode PAD.

Then, a passivation film 420 is formed on the first touch electrode TE1 and the second touch electrode TE2.

Although not shown in detail, the first substrate 111 where the passivation film 420 is formed is bonded to the second substrate 112. The first substrate 111 and the second substrate 112 may be bonded to each other in such a manner that the passivation film 420 of the first substrate 111 and the second substrate 112 are adhered to each other using an adhesive layer (not shown). The adhesive layer (not shown) may be an optically clear resin (OCR) or an optically clear adhesive film (OCA).

In the display device 100 according to one embodiment of the present disclosure, since the first inorganic film 310 is extended to the pad area PA, it is not required to arrange a mask for covering the pad area PA so as not to form the first inorganic film 310 on the pad area PA. Therefore, in the display device 100 according to one embodiment of the present disclosure, a mask is not arranged on the pad area PA to prevent arcing from being generated between a boundary surface of the mask and the pad electrode and prevent a defect from being generated due to a high current from the mask, which flows into the display device.

FIGS. 9A to 9D are cross-sectional views illustrating a method of manufacturing a display device according to another embodiment of the present disclosure.

Plane views shown in FIGS. 9A to 9D relate to a method of manufacturing a display device according to one embodiment of the present disclosure shown in FIG. 6, and the same reference numerals are given to the same elements as those of FIG. 6. Also, the method of manufacturing a display device according to another embodiment of the present disclosure relates to a method of forming a bridge contact hole BCT, a touch contact hole TCT, an open hole OH, and a pad contact hole PCT. Therefore, the following description will be given based on a method of manufacturing a bridge contact hole BCT, a touch contact hole TCT, an open hole OH, and a pad contact hole PCT, and repeated description of the same elements will be omitted.

Figure 9A:
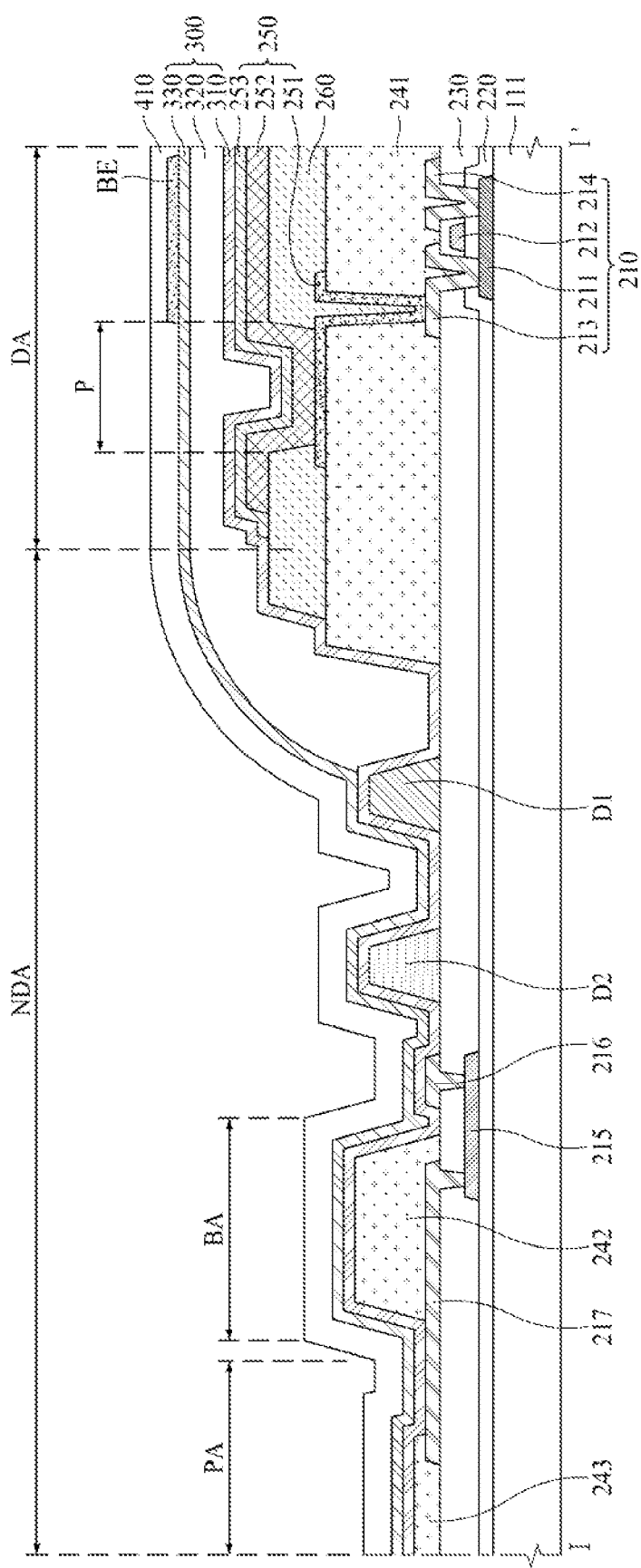
FIGS. 9A to 9D are cross-sectional views illustrating a method of manufacturing a display device according to another embodiment of the present disclosure.

First of all, as shown in FIG. 9A, an insulating film 410 is entirely formed on a first substrate 111.

Figure 9B:
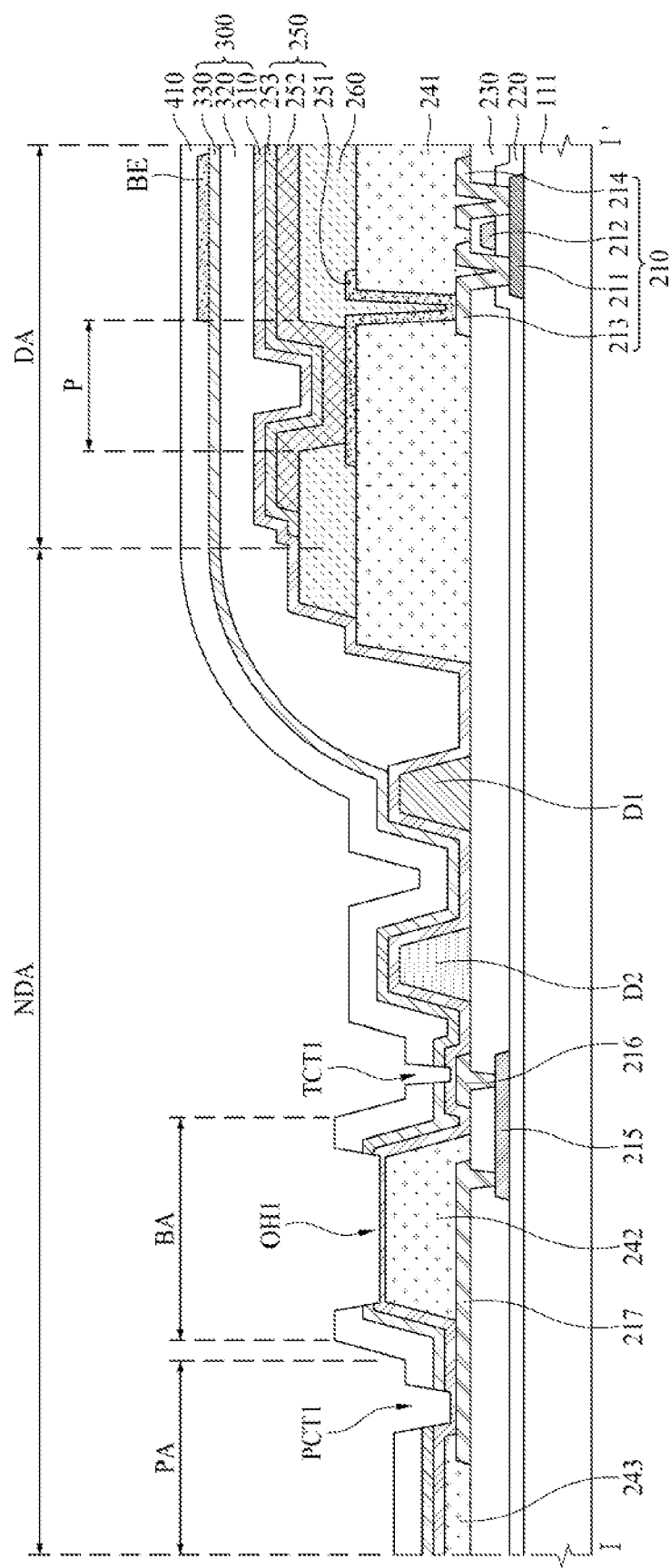

Secondly, as shown in FIG. 9B, after a first inorganic film 310 provided on the second and third connection lines 216 and 217 and an organic pattern 242 partially remains, a second inorganic film 330 on a touch contact hole TCT1, an open hole OH1 and a pad contact hole PCT1, and the insulating film 410 are removed. At this time, a bridge contact hole BCT is not formed. If the bridge contact hole BCT, the touch contact hole TCT, the open hole OH and the pad contact hole PCT are simultaneously formed through an etching process like one embodiment, the bridge electrode BE and the second and third connection lines 216 and 217 may be damaged. Therefore, in the method of manufacturing a display device according to another embodiment of the present disclosure, the touch contact hole TCT1, the open hole OH1 and the pad contact hole PCT1, which should pass through a relatively thick layer, are first formed such that the first inorganic film 310 may partially remain, and the bridge contact hole BCT is not formed.

Figure 9C:
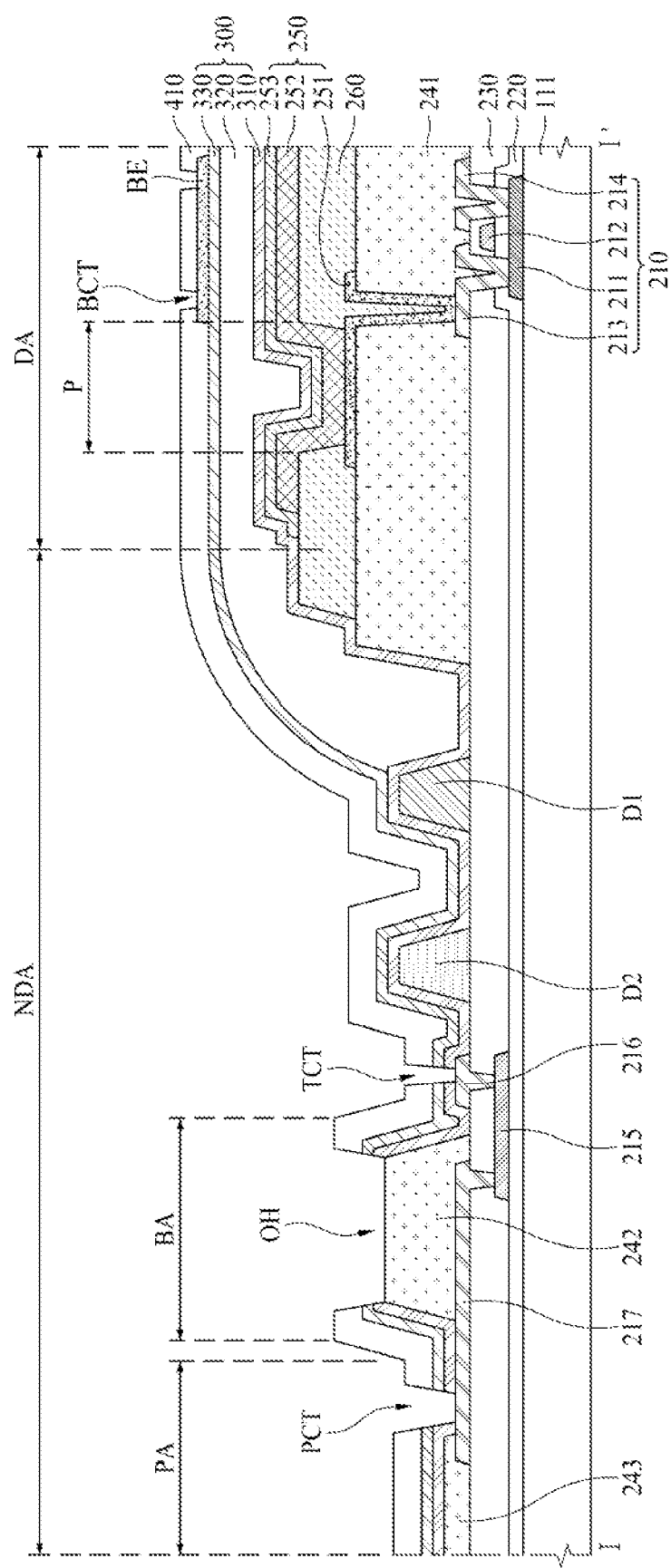

Thirdly, as shown in FIG. 9C, the bridge contact hole BCT, the touch contact hole TCT, the open hole OH and the pad contact hole PCT are formed.

The first inorganic film 310, which partially remains in the touch contact hole TCT, the open hole OH and the pad contact hole PCT1, and the insulating film 410 on the bridge electrode BE are simultaneously removed through an etching process. The first inorganic film 310 which remains in a relatively thin thickness and the insulating film 410 on the bridge electrode BE are removed through an weak etching process such that the second and third connection lines 216 and 217 and the bridge electrode BE may not be damaged. Therefore, in the method of manufacturing a display device according to another embodiment of the present disclosure, the second and third connection lines 216 and 217 and the bridge electrode BE may be prevented from being damaged when the bridge contact hole BCT, the touch contact hole TCT, the open hole OH and the pad contact hole PCT are formed.

Figure 9D:
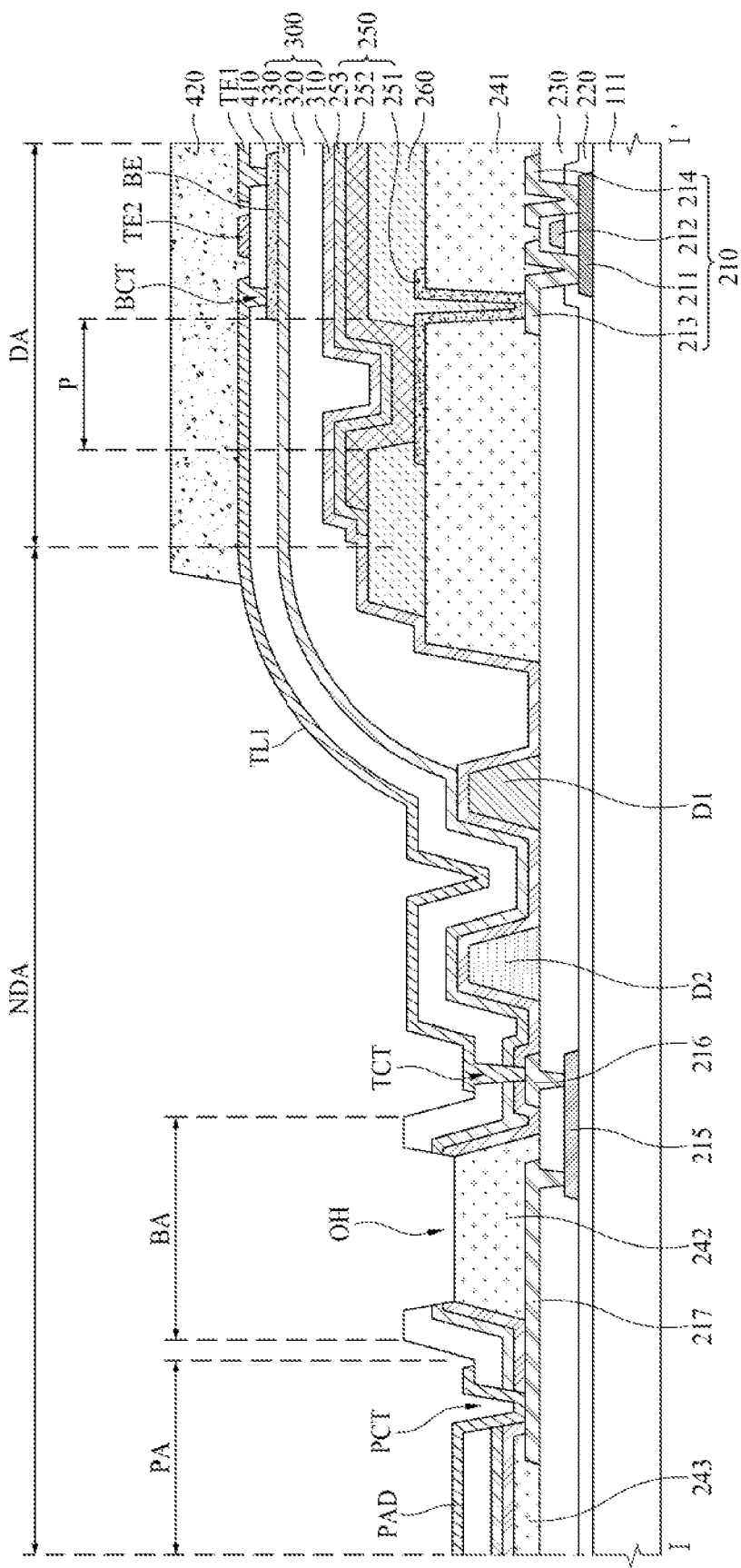

Fourthly, as shown in FIG. 9D, first and second touch electrodes TE1 and TE2, first and second touch lines TL1 and TL2, and a pad electrode PAD are formed, and a passivation film 420 is formed.

The display device 100, which is shown in FIGS. 9A and 9D, is the same as the display device 100 according to one embodiment described with reference to FIGS. 8A to 8F. Therefore, repeated description of the same elements will be omitted.

As described above, in the display device 100 according to one embodiment of the present disclosure, a mask is not arranged on the pad area PA to prevent arcing from being generated between a boundary surface of the mask and the pad electrode PAD arranged on the pad area PA or the metal line such as the third connection line 217 and prevent a defect from being generated due to a high current from the mask, which flows into the display device along the metal line.

Also, in the display device 100 according to one embodiment of the present disclosure, since the first inorganic film 310 formed to reach the pad area PA serves as an insulating film, arcing is not generated even though the mask is arranged on the pad area PA during the manufacturing process of the second inorganic film 330.

In the display device 100 according to one embodiment of the present disclosure, since the metal line such as the third connection line 217 is not exposed by the first inorganic film 310 and the second inorganic film 330 when the bridge electrode BE is formed, it is not required to form the buffer layer. Therefore, in the display device 100 according to one embodiment of the present disclosure, the buffer layer is omitted, whereby the manufacturing cost may be reduced and the process may be reduced.

As described above, according to the present disclosure, the following advantages may be obtained.

In the display device according to one embodiment of the present disclosure, since the first inorganic film is formed to be extended to the pad area, it is not required to arrange the mask for covering the pad area so as not to form the first inorganic film on the pad area.

Therefore, in the display device according to one embodiment of the present disclosure, the mask is not arranged on the pad area to prevent arcing from being generated between the boundary surface of the mask and the pad electrode arranged on the pad area or the metal line and prevent a defect from being generated due to a high current from the mask, which flows into the display device along the metal line.

Also, in the display device according to one embodiment of the present disclosure, since the metal line is not exposed by the first inorganic film when the bridge electrode is formed, the buffer layer is omitted, whereby the manufacturing cost may be reduced and the process may be reduced.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a first substrate including a display area on which pixels are arranged and a non-display area including a pad area and a bending area disposed between the pad area and the display area;
a dam disposed between the bending area and the display area;
a pad electrode disposed at the pad area;
an encapsulation film including a first inorganic film, a second inorganic film on the first inorganic film, and an organic film between the first inorganic film and the second inorganic film, and the organic film of the encapsulation film covers the display area;
an organic pattern disposed between the dam and the pad electrode;
a touch sensing layer disposed on the second inorganic film;
a touch line being electrically connected with the touch sensing layer; and
a connection line being electrically connected to the pad electrode and the touch line, and including first, second and third connection lines,
wherein the second connection line is electrically connected with one side of the first connection line, and the third connection line is disposed on the same layer as the second connection line, spaced apart from the second connection line and electrically connected with the other side of the first connection line, and
wherein the organic pattern is disposed on an upper portion of the third connection line.

2. The display device of claim 1, wherein the touch sensing layer include a bridge electrode, a first touch electrodes, a second touch electrode and a touch insulating film between the first and second touch electrodes and the bridge electrode, and
wherein the touch line is disposed on the touch insulating film of the touch sensing layer, and include a first touch line electrically connected with the first touch electrode and a second touch line electrically connected with the second touch electrode.

3. The display device of claim 1, wherein the touch line overlaps the dam disposed between the first substrate and the first inorganic film of the encapsulation film.

4. The display device according to claim 1, wherein the organic pattern is arranged at the bending area.

5. The display device according to claim 2, wherein the first inorganic film covers the dam and is arranged at the pad area, and
wherein the second inorganic film is disposed on the organic film to cover the organic film, arranged at the pad area and overlapped with the dam.

6. The display device according to claim 5, wherein an end of the first inorganic film and an end of the second inorganic film are in line with each other.

7. The display device according to claim 1, further comprising:
a thin film transistor provided at the display area of the first substrate; and
a planarization film arranged on the thin film transistor.

8. The display device according to claim 7, wherein the organic pattern is disposed in the same layer as the planarization film.

9. The display device according to claim 7, wherein the first connection line is disposed in the same layer as a gate electrode of the thin film transistor.

10. The display device according to claim 8, wherein the second connection line and the third connection lie are disposed in the same layer as a source electrode and a drain electrode of the thin film transistor.

11. The display device according to claim 10, wherein the encapsulation film is not disposed on at least portion of the upper surface of the organic pattern.

12. The display device according to claim 1, wherein the first touch line is electrically connected with the third connection line through a touch contact hole, and
wherein the pad electrode is electrically connected with the second connection line through a pad contact hole.

13. The display device according to claim 7, further comprising a line protective film covering an end of the second connection line, wherein the line protective film is arranged on the same layer as the planarization film.

14. The display device according to claim 1, wherein the bridge electrode is disposed on the second inorganic film of the encapsulation film, and the first and second touch electrodes are disposed on the touch insulating film, and
wherein the bridge electrode is connected with the first touch electrode through a contact hole of the touch insulating film.

* * * * *